United States Patent
Guo et al.

(10) Patent No.: US 9,357,185 B2
(45) Date of Patent: May 31, 2016

(54) CONTEXT OPTIMIZATION FOR LAST SIGNIFICANT COEFFICIENT POSITION CODING

(71) Applicant: Qualcomm Incorporated, San Diego, CA (US)

(72) Inventors: Liwei Guo, San Diego, CA (US); Wei-Jung Chien, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 700 days.

(21) Appl. No.: 13/669,096

(22) Filed: Nov. 5, 2012

(65) Prior Publication Data

US 2013/0114676 A1 May 9, 2013

Related U.S. Application Data

(60) Provisional application No. 61/557,317, filed on Nov. 8, 2011, provisional application No. 61/561,909, filed on Nov. 20, 2011, provisional application No. 61/588,579, filed on Jan. 19, 2012, provisional application No. 61/596,049, filed on Feb. 7, 2012.

(51) Int. Cl.
*H04N 19/10* (2014.01)
*H03M 7/40* (2006.01)
(Continued)

(52) U.S. Cl.
CPC ......... *H04N 7/26005* (2013.01); *H03M 7/4018* (2013.01); *H03M 7/4037* (2013.01); *H04N 19/10* (2014.11); *H04N 19/13* (2014.11); *H04N 19/176* (2014.11); *H04N 19/18* (2014.11)

(58) Field of Classification Search
CPC .. H03M 7/4018; H03M 7/4037; H04N 19/10; H04N 19/13
USPC ..................................................... 375/240.02
See application file for complete search history.

(56) References Cited

U.S. PATENT DOCUMENTS 7,088,271 B2  8/2006  Marpe et al.
7,564,384 B2  7/2009  He et al.
(Continued)

FOREIGN PATENT DOCUMENTS

WO  2011128268 A1  10/2011
WO  2011142817 A1  11/2011

OTHER PUBLICATIONS

Vadim Seregin et al: "Binarisation modification for last position coding ", 6th JCT-VC Meeting: Torino, IT, Jul. 14-22, 2011.*
(Continued)

*Primary Examiner* — Tat Chio
*Assistant Examiner* — Fabio Lima
(74) *Attorney, Agent, or Firm* — Shumaker & Sieffert, P.A.

(57) ABSTRACT

A video encoder is configured to encode a binary sting indicating a position of a last significant coefficient within a video block. A video decoder is configured to decode the encoded binary string. The string may be coded using context adaptive binary arithmetic coding (CABAC). Binary indices of the binary string may be assigned a context. The context may be determined according to a mapping function. A context may be a assigned to one or more binary indices where each index is associated with a different block size. The last binary index of a 16×16 video block may share a context with the last binary index of a 32×32 video block.

29 Claims, 9 Drawing Sheets

(51) Int. Cl.
 *H04N 19/176* (2014.01)
 *H04N 19/13* (2014.01)
 *H04N 19/18* (2014.01)

(56) References Cited

U.S. PATENT DOCUMENTS

| | | | |
|---|---|---|---|
| 7,702,013 B2 | 4/2010 | Schwarz et al. | |
| 2006/0017592 A1 | 1/2006 | Shim et al. | |
| 2007/0242894 A1 | 10/2007 | Kautzer et al. | |
| 2010/0040136 A1 | 2/2010 | Sabo | |
| 2012/0014454 A1 | 1/2012 | Budagavi et al. | |
| 2012/0099646 A1 | 4/2012 | Coban et al. | |
| 2012/0230402 A1 | 9/2012 | Auyeung et al. | |
| 2012/0262313 A1* | 10/2012 | He et al. | 341/87 |
| 2013/0003858 A1* | 1/2013 | Sze | 375/240.18 |
| 2013/0107969 A1* | 5/2013 | Nguyen et al. | 375/240.18 |
| 2013/0114676 A1* | 5/2013 | Guo et al. | 375/240.02 |
| 2013/0114738 A1 | 5/2013 | Chien et al. | |
| 2014/0192861 A1* | 7/2014 | Chuang et al. | 375/240.02 |
| 2014/0334539 A1 | 11/2014 | Kim et al. | |

OTHER PUBLICATIONS

Cheung Auyeung et al: "Context reduction of the last transform position in JCTVC-D262 for CE11.1", 5th JCT-VC Meeting: Geneva, CH, Mar. 16-23, 2011.*

Bossen, "Common test conditions and software reference configurations," JCTVC-F900, Joint Collaborative Team on Video Coding (JCT-VC) of ITU-T SG16 WP3 and ISO/IEC JTC1/SC29/WG11, 6th Meeting: Torino, IT, Jul. 14-22, 2011, pp. 1-3.

Bross et al., "High efficiency video coding (HEVC) text specification draft 6," 7th Meeting: Geneva, CH, Nov. 21-30, 2011, JCTVC-H1003, 259 pp.

Bross et al., "High efficiency video coding (HEVC) text specification draft 7," 9th Meeting: Geneva, CH, Apr. 27-May 7, 2012, JCTVC-I1003_d21, 290 pp.

Bross et al., "High efficiency video coding (HEVC) text specification draft 8," 10th Meeting: Stockholm, SE, Jul. 11-20, 2012, JCTVC-J1003_d7, 261 pp.

Bross et al., "WD4: Working Draft 4 of High-Efficiency Video Coding," 6th Meeting: JCTVC-F803_d2, Torino, IT, Jul. 14-22, 2011, 226 pp.

Bross et al., "WD5: Working Draft 5 of High-Efficiency Video Coding," 7th Meeting: Geneva, Switzerland, Nov. 2011, JCTVC-G1103_d2, 214 pp.

Budagavi et al., "Parallel context processing techniques for high coding efficiency entropy coding in HEVC," JCTVC Meeting, Jul. 21, 2010-Jul. 28, 2010; Geneva, CH, JCTVC-B088, Jul. 24, 2010, 11 pp.

Chien, et al., "Last position coding for CABAC," JCTVC-G704, 7th Meeting: Geneva, Nov. 21-30, 2011, 4 pages.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Seregin, et al., "Binarisation modification for last position coding," JCTVC-F375, 6th Meeting, Torino, IT, Jul. 14-22, 2011, pp. 1-10.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011,193 pp.

U.S. Appl. No. 13/669,032, by Wei-Jung Chien, filed Nov. 5, 2012.

Auyeung et al., "Context reduction of the last transform position in JCTVC-D262 for CE11.1", JCT-VC meeting; Mpeg meeting; Mar. 16, 2011-Mar. 23, 2011; Geneva; (Joint Collaborative Team on Video Coding of ISO/IEC JTC1/SC29/WG11and ITU-T SG.16 ); URL: http://wftp3.itu.int/av-arch/jctvc-site/ No. JCTVC-E344, XP030008850, 6 pp.

Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.

Guo, et al., "CABAC Contexts Reducing for Last position Coding—Revision 3 (JCTVC-HO537r3)", Feb. 3, 2012, XP055051244, Retrieved from the internet: URL: HTTP://phemix. int-evry. fr/jct/index.php, 5 pp.

Hsiang, et al., "Non-CE11: Modified methods for coding the positions of last significant coefficient in the CABAC mode" JCT-VC Meeting; MPEG Meeting; Nov. 21, 2011-Nov. 30, 2011; Geneva; (Joint Collaborative Team on Video Coding of ISO/IEC JTC1/SC29/WG11 and ITU-T SG.16); URL: http://wftp3.itu.int/av-arch/jctvc-site/, No. JCTVC-G239, XP030110223, "Proposed Algorithm", 4 pp.

International Preliminary Report on Patentability—PCT/US2012/063717—The International Bureau of WIPO Geneva, Switzerland, Feb. 17, 2014, 13 pp.

International Search Report and Written Opinion—PCT/US2012/063717—ISA/EPO—Feb. 4, 2013, 16 pp.

Marpe, et al., "Context-based adaptive binary arithmetic coding in the H.264/AVC video compression standard", IEEE Transactions on Circuits and Systems for Video Technology, Jul. 2003, vol. 13 (7), pp. 620-636.

Nguyen, et al., "Modified binarization and coding of MVD for PIPE/CABACU", JCT-VC Meeting; MPEG Meeting; Jul. 14, 2011-Jul. 22, 2011; Torino; (Joint Collaborative Team on Video Coding of ISO/IEC JTC1/SC29/WG11 and ITU-TSG. 16 ); URL: http://wftp3.itu.int/av-arch/jctvc-site/, No. JCTVC-F455, XP030009478, 2 pp.

Nguyen, et al., "Reduced-Complexity entropy coding of transform coefficient levels using truncated golomb-rice codes in video compression," Image Processing (ICIP), 2011 18th IEEE International Conference on IEEE, Sep. 11, 2011, pp. 753-756.

Sole et al., "CE11: Parallel Context Processing for the significance map in high coding efficiency", JCT-VC Meeting; MPEG Meeting; Mar. 16, 2011-Mar. 23, 2011; Geneva; (Joint Collaborative Team on Video Coding of ISO/IEC JTC1/SC29/W11and ITU-T SG.16); URL: http://wftp3.itu.int/av-arch/jctvc-site/ No. JCTVC-E338, XP030008844, 4 pp.

Sole, et al., "Parallel Context Processing for the significance map in high coding efficiency", JCT-VC Meeting; MPEG Meeting; Jan. 20, 2011-Jan. 28, 2011; Daegu; (Joint Collaborative Team on Video Coding of ISO/IEC JTC1/SC29/WG11 and ITU-T SG. 16); URL: http://wftp3.itu.int/av-arch/jctvc-site/, No. JCTVC-D262, XP030008302, 4 pp.

ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.

ITU-T H.265, Series H: Audiovisual and Multimedia Systems, Infrastructure of audiovisual services—Coding of moving video, High efficiency video coding, The International Telecommunication Union, Oct. 2014, 540 pp.

Okubo, "Impress Standard Textbook Series—3rd Revision of H.264/AVC Textbook," 1st Edition, Jan. 1, 2009, Impress R&D, pp. 153-162, ISBN: 978-4-8443-2664-9. [Partial Translation].

* cited by examiner

US 9,357,185 B2

CONTEXT OPTIMIZATION FOR LAST SIGNIFICANT COEFFICIENT POSITION CODING

RELATED APPLICATIONS

This application claims the benefit of:

U.S. Provisional Application No. 61/557,317, filed Nov. 8, 2011;

U.S. Provisional Application No. 61/561,909, filed Nov. 20, 2011;

U.S. Provisional Patent Application No. 61/588,579, filed Jan. 19, 2012; and

U.S. Provisional Patent Application No. 61/596,049, filed Feb. 7, 2012, each of which is hereby incorporated by reference in its respective entirety.

TECHNICAL FIELD

This disclosure relates to video coding, and more particularly to techniques for coding transform coefficients.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. Video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

In general, this disclosure describes techniques for coding video data. In particular, this disclosure describes techniques for coding transform coefficients.

In one example of the disclosure, a method of encoding transform coefficients comprises obtaining a binary string indicating a position of a last significant coefficient within a block of transform coefficients associated with a video block; determining a context for a binary index of the binary string based on a video block size, wherein the context is assigned to at least two binary indices, wherein each of the at least two binary indices are associated with different video block sizes; and encoding the binary string using context adaptive binary arithmetic coding (CABAC) based at least in part on the determined context.

In another example of the disclosure, a method of decoding transform coefficients comprises obtaining an encoded binary string indicating a position of a last significant coefficient within a block of transform coefficients associated with a video block, wherein the encoded binary string is encoded using CABAC; determining a context for a binary index of the encoded binary string based on a video block size, wherein the context is assigned to at least two binary indices, wherein each of the at least two binary indices are associated with different video block sizes; and decoding the encoded binary string using CABAC based at least in part on the determined context.

In another example of the disclosure, an apparatus configured to encode transform coefficients in a video encoding process comprises means for obtaining a binary string indicating a position of a last significant coefficient within a block of transform coefficients associated with a video block means for determining a context for a binary index of the binary string based on a video block size, wherein the context is assigned to at least two binary indices, wherein each of the at least two binary indices are associated with different video block sizes; and means for encoding the binary string using CABAC based at least in part on the determined context.

In another example of the disclosure, an apparatus configured to decode transform coefficients in a video decoding process comprises means for obtaining an encoded binary string indicating a position of a last significant coefficient within a block of transform coefficients associated with a video block, wherein the encoded binary string is encoded using CABAC; means for determining a context for a binary index of the encoded binary string based on a video block size, wherein the context is assigned to at least two binary indices, wherein each of the at least two binary indices are associated with different video block sizes; and means for decoding the encoded binary string using CABAC based at least in part on the determined context.

In another example of the disclosure, a device comprises a video encoder configured to obtain a binary string indicating a position of a last significant coefficient within a block of transform coefficients associated with a video block; determine a context for a binary index of the binary string based on a video block size, wherein the context is assigned to at least two binary indices, wherein each of the at least two binary indices are associated with different video block sizes; and encode the binary string using CABAC based at least in part on the determined context.

In another example of the disclosure, a device comprises a video decoder configured to obtain an encoded binary string indicating a position of a last significant coefficient within a block of transform coefficients associated with a video block, wherein the encoded binary string is encoded using CABAC; determine a context for a binary index of the encoded binary string based on a video block size, wherein the context is assigned to at least two binary indices, wherein each of the at least two binary indices are associated with different video block sizes; and decode the encoded binary string using CABAC based at least in part on the determined context.

In another example of the disclosure, a non-transitory computer-readable storage medium has instructions stored thereon that upon execution cause a video encoding device to obtain a binary string indicating a position of a last significant coefficient within a block of transform coefficients associated with a video block; determine a context for a binary index of the binary string based on a video block size, wherein the context is assigned to at least two binary indices, wherein each of the at least two binary indices are associated with different video block sizes; and encode the binary string using CABAC based at least in part on the determined context.

In another example of the disclosure, a non-transitory computer-readable storage medium has instructions stored thereon that upon execution cause a video decoding device to obtain an encoded binary string indicating a position of a last significant coefficient within a block of transform coefficients associated with a video block, wherein the encoded binary string is encoded using CABAC; determine a context for a binary index of the encoded binary string based on a video block size, wherein the context is assigned to at least two binary indices, wherein each of the at least two binary indices are associated with different video block sizes; and decode the encoded binary string using CABAC based at least in part on the determined context.

The details of one or more examples are set forth in the accompanying drawings and the description below. Other features, objects, and advantages will be apparent from the description and drawings, and from the claims.

DETAILED DESCRIPTION

In general, this disclosure describes techniques for coding video data. In particular, this disclosure describes techniques for coding transform coefficients in a video encoding and/or decoding process. In block-based video coding, a block of transform coefficients may be arranged in a two-dimensional (2D) array. A scanning process may be performed to rearrange the two-dimensional (2D) array of transform coefficients into an ordered, one-dimensional (1D) array, i.e., vector, of transform coefficients. One or more syntax elements may be used to indicate a position of a last significant coefficient (i.e., non-zero coefficient) within the block of transform coefficients based on a scan order. The position of the last significant coefficient may be used by a video encoder to optimize the encoding of the transform coefficients. Likewise, a video decoder may use the position of the last significant coefficient to optimize the decoding of transform coefficients. Thus, it is desirable to efficiently code the one or more syntax elements that indicate a position of a last significant coefficient.

This disclosure describes techniques for coding the one or more syntax elements that indicate a position of a last significant coefficient. In some examples, all or a portion of the syntax elements that indicate the position of a last significant coefficient may be entropy coded according to any one of the following techniques: Context Adaptive Variable Length Coding (CAVLC), Context Adaptive Binary Arithmetic Coding (CABAC), Probability Interval Partitioning Entropy Coding (PIPE), or the like. In entropy coding techniques that utilize binary indices which may also be referred to as "bins" or "bin indices") and context assignments, a common context assignment may be utilized for bins for different transform block (TU) sizes and/or different color components. In this manner, the total number of contexts can be reduced. By reducing the total number of contexts a video encoder and/or video decoder may more efficiently code syntax elements that indicate a position of a last significant coefficient, as fewer contexts need to be stored.

Figure 1:
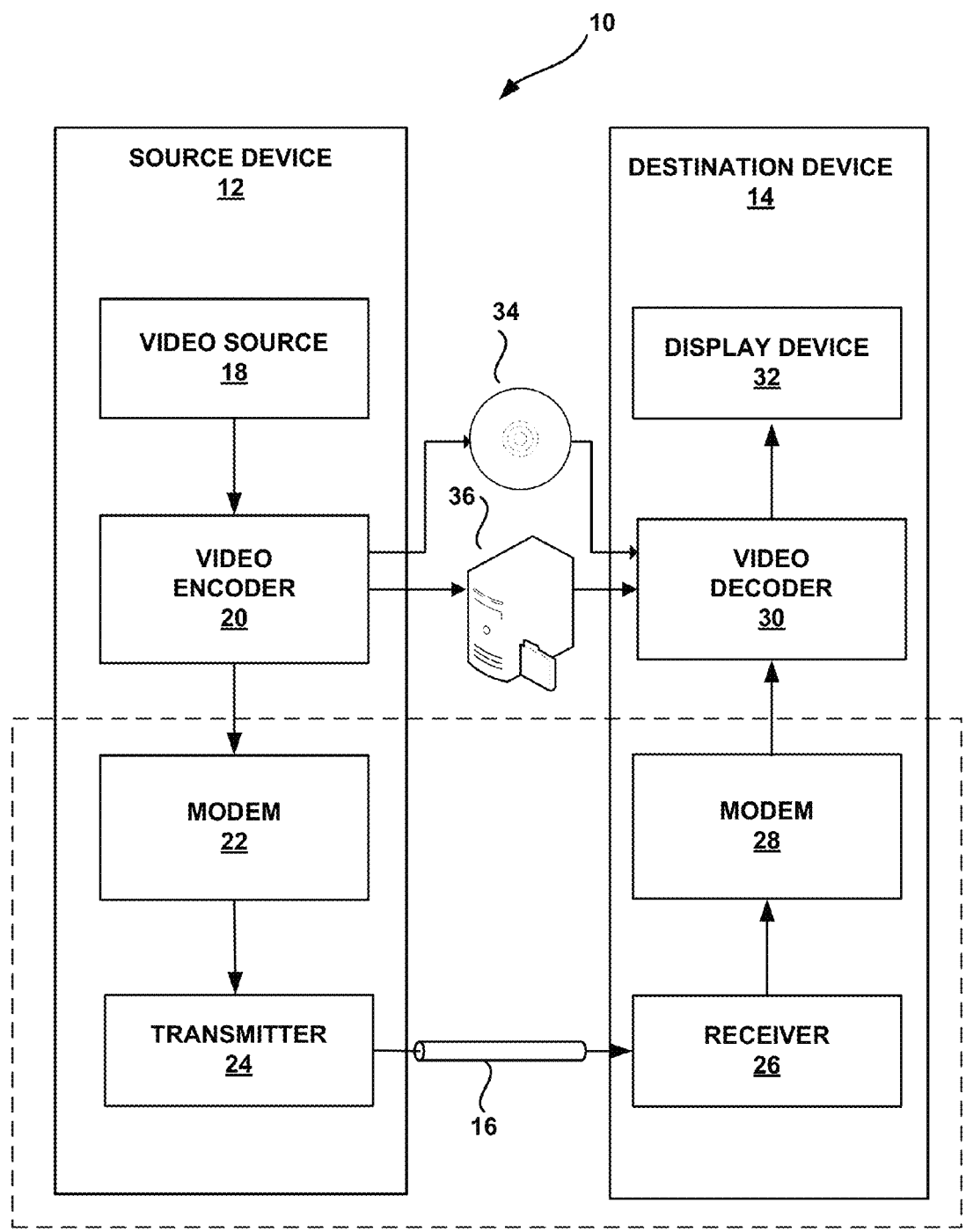
FIG. 1 is a block diagram illustrating an example video encoding and decoding system.

FIG. 1 is a block diagram illustrating an example video encoding and decoding system 10 that may be configured to utilize techniques for coding transform coefficients in accordance with examples of this disclosure. As shown in FIG. 1, the system 10 includes a source device 12 that transmits encoded video to a destination device 14 via a communication channel 16. Encoded video data may also be stored on a storage medium 34 or a file server 36 and may be accessed by the destination device 14 as desired. When stored to a storage medium or file server, video encoder 20 may provide coded video data to another device, such as a network interface, a compact disc (CD), Blu-ray or digital video disc (DVD) burner or stamping facility device, or other devices, for storing the coded video data to the storage medium. Likewise, a device separate from video decoder 30, such as a network interface, CD or DVD reader, or the like, may retrieve coded video data from a storage medium and provided the retrieved data to video decoder 30.

The source device 12 and the destination device 14 may comprise any of a wide variety of devices, including desktop computers, notebook (i.e., laptop) computers, tablet computers, set-top boxes, telephone handsets such as so-called smartphones, televisions, cameras, display devices, digital media players, video gaming consoles, or the like. In many cases, such devices may be equipped for wireless communication. Hence, the communication channel 16 may comprise a wireless channel, a wired channel, or a combination of wireless and wired channels suitable for transmission of encoded video data. Similarly, the file server 36 may be accessed by the destination device 14 through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server.

Techniques for coding transform coefficients, in accordance with examples of this disclosure, may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, the system 10 may be configured to support one-way or two-way video transmission to support applications such as video streaming, video playback, video broadcasting, and/or video telephony.

In the example of FIG. 1, the source device 12 includes a video source 18, a video encoder 20, a modulator/demodulator 22 and a transmitter 24. In the source device 12, the video source 18 may include a source such as a video capture device, such as a video camera, a video archive containing previously captured video, a video feed interface to receive video from a video content provider, and/or a computer graphics system for generating computer graphics data as the source video, or a combination of such sources. As one example, if the video source 18 is a video camera, the source device 12 and the destination device 14 may form so-called camera phones or video phones. However, the techniques described in this disclosure may be applicable to video coding in general, and may be applied to wireless and/or wired applications, or application in which encoded video data is stored on a local disk.

The captured, pre-captured, or computer-generated video may be encoded by the video encoder 20. The encoded video information may be modulated by the modem 22 according to a communication standard, such as a wireless communication protocol, and transmitted to the destination device 14 via the transmitter 24. The modem 22 may include various mixers, filters, amplifiers or other components designed for signal modulation. The transmitter 24 may include circuits designed for transmitting data, including amplifiers, filters, and one or more antennas.

The captured, pre-captured, or computer-generated video that is encoded by the video encoder 20 may also be stored onto a storage medium 34 or a file server 36 for later consumption. The storage medium 34 may include Blu-ray discs, DVDs, CD-ROMs, flash memory, or any other suitable digital storage media for storing encoded video. The encoded video stored on the storage medium 34 may then be accessed by the destination device 14 for decoding and playback.

The file server 36 may be any type of server capable of storing encoded video and transmitting that encoded video to the destination device 14. Example file servers include a web server (e.g., for a website), an FTP server, network attached storage (NAS) devices, a local disk drive, or any other type of device capable of storing encoded video data and transmitting it to a destination device. The transmission of encoded video data from the file server 36 may be a streaming transmission, a download transmission, or a combination of both. The file server 36 may be accessed by the destination device 14 through any standard data connection, including an Internet connection. This may include a wireless channel (e.g., a Wi-Fi connection), a wired connection (e.g., DSL, cable modem, Ethernet, USB, etc.), or a combination of both that is suitable for accessing encoded video data stored on a file server.

The destination device 14, in the example of FIG. 1, includes a receiver 26, a modem 28, a video decoder 30, and a display device 32. The receiver 26 of the destination device 14 receives information over the channel 16, and the modem 28 demodulates the information to produce a demodulated bitstream for the video decoder 30. The information communicated over the channel 16 may include a variety of syntax information generated by the video encoder 20 for use by the video decoder 30 in decoding video data. Such syntax may also be included with the encoded video data stored on the storage medium 34 or the file server 36. Each of the video encoder 20 and the video decoder 30 may form part of a respective encoder-decoder (CODEC) that is capable of encoding or decoding video data.

The display device 32 may be integrated with, or external to, the destination device 14. In some examples, the destination device 14 may include an integrated display device and also be configured to interface with an external display device. In other examples, the destination device 14 may be a display device. In general, the display device 32 displays the decoded video data to a user, and may comprise any of a variety of display devices such as a liquid crystal display (LCD), a plasma display, an organic light emitting diode (OLED) display, or another type of display device.

In the example of FIG. 1, the communication channel 16 may comprise any wireless or wired communication medium, such as a radio frequency (RF) spectrum or one or more physical transmission lines, or any combination of wireless and wired media. The communication channel 16 may form part of a packet-based network, such as a local area network, a wide-area network, or a global network such as the Internet. The communication channel 16 generally represents any suitable communication medium, or collection of different communication media, for transmitting video data from the source device 12 to the destination device 14, including any suitable combination of wired or wireless media. The communication channel 16 may include routers, switches, base stations, or any other equipment that may be useful to facilitate communication from the source device 12 to the destination device 14.

The video encoder 20 and the video decoder 30 may operate according to a video compression standard, such as the High Efficiency Video Coding (HEVC) standard presently being developed by the Joint Collaboration Team on Video Coding (JCT-VC) of ITU-T Video Coding Experts Group (VCEG) and ISO/IEC Motion Picture Experts Group (MPEG), and may conform to the HEVC Test Model (HM). Video encoder 20 and video decoder 30 may operate according to a recent draft of the HEVC standard, referred to as "HEVC Working Draft 5" or "WD5," is described in document JCTVC-G1103, Bross et al., "WD5: Working Draft 5 of High efficiency video coding (HEVC)," Joint Collaborative Team on Video Coding (JCT-VC) of ITU-T SG16 WP3 and ISO/IEC JTC1/SC29/WG11, 7th Meeting: Geneva, CH, November, 2012. Further, another recent working draft of HEVC, Working Draft 7, is described in document HCTVC-11003, Bross et al., "High Efficiency Video Coding (HEVC) Text Specification Draft 7," Joint Collaborative Team on Video Coding (JCT-VC) of ITU-T SG16 WP3 and ISO/IEC JTC1/SC29/WG11, 9th Meeting: Geneva, Switzerland, Apr. 27, 2012 to May 7, 2012. Alternatively, the video encoder 20 and the video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples include MPEG-2 and ITU-T H.263.

Although not shown in FIG. 1, in some aspects, the video encoder 20 and the video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

The video encoder 20 and the video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of the video encoder 20 and the video decoder 30 may be included in one or more encoders or decoders, either of which may be integrated as part of a combined encoder/decoder (CODEC) in a respective device.

The video encoder 20 may implement any or all of the techniques of this disclosure for coding transform coefficients in a video encoding process. Likewise, the video decoder 30 may implement any or all of these techniques for coding transform coefficients in a video coding process. A video coder, as described in this disclosure, may refer to a video encoder or a video decoder. Similarly, a video coding unit may refer to a video encoder or a video decoder. Likewise, video coding may refer to video encoding or video decoding.

Video encoder 20 and Video decoder 30 of FIG. 1 represent examples of video coders configured to obtain a binary string indicating a position of a last significant coefficient within a video block, determine a context for a binary index of the binary string based on a video block size, wherein the context is assigned to at least two binary indices, wherein each of the at least two binary indices are associated with different video block sizes; and code the binary string using context adaptive binary arithmetic coding (CABAC) based at least in part on the determined context.

For video coding according to the HEVC standard currently under development, a video frame may be partitioned into coding units. A coding unit (CU) generally refers to an image region that serves as a basic unit to which various coding tools are applied for video compression. A CU usually has a luminance component, denoted as Y, and two chroma components, denoted as U and V. Depending on the video sampling format, the size of the U and V components, in terms of number of samples, may be the same as or different from the size of the Y component. A CU is typically square, and may be considered to be similar to a so-called macroblock, e.g., under other video coding standards such as ITU-T H.264. Coding according to some of the presently proposed aspects of the developing HEVC standard will be described in this application for purposes of illustration. However, the techniques described in this disclosure may be useful for other video coding processes, such as those defined according to H.264 or other standard or proprietary video coding processes. HEVC standardization efforts are based on a model of a video coding device referred to as the HEVC Test Model (HM). The HM presumes several capabilities of video coding devices over devices according to, e.g., ITU-T H.264/AVC. For example, whereas H.264 provides nine intra-prediction encoding modes, HM provides as many as thirty-four intra-prediction encoding modes.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may include one or more TUs or PUs that correspond to a coding node within a CU. The video blocks may have fixed or varying sizes, and may differ in size according to a specified coding standard.

According to the HM, a CU may include one or more prediction units (PUs) and/or one or more transform units (TUs). Syntax data within a bitstream may define a largest coding unit (LCU), which is a largest CU in terms of the number of pixels. In general, a CU has a similar purpose to a macroblock of H.264, except that a CU does not have a size distinction. Thus, a CU may be split into sub-CUs. In general, references in this disclosure to a CU may refer to a largest coding unit of a picture or a sub-CU of an LCU. An LCU may be split into sub-CUs, and each sub-CU may be further split into sub-CUs. Syntax data for a bitstream may define a maximum number of times an LCU may be split, referred to as CU depth. Accordingly, a bitstream may also define a smallest coding unit (SCU). This disclosure also uses the term "block" or "portion" to refer to any of a CU, PU, or TU. In general, "portion" may refer to any sub-set of a video frame.

An LCU may be associated with a quadtree data structure. In general, a quadtree data structure includes one node per CU, where a root node corresponds to the LCU. If a CU is split into four sub-CUs, the node corresponding to the CU includes four leaf nodes, each of which corresponds to one of the sub-CUs. Each node of the quadtree data structure may provide syntax data for the corresponding CU. For example, a node in the quadtree may include a split flag, indicating whether the CU corresponding to the node is split into sub-CUs. Syntax elements for a CU may be defined recursively, and may depend on whether the CU is split into sub-CUs. If a CU is not split further, it is referred as a leaf-CU. In this disclosure, 4 sub-CUs of a leaf-CU will also be referred to as leaf-CUs although there is no explicit splitting of the original leaf-CU. For example if a CU at 16×16 size is not split further, the four 8×8 sub-CUs will also be referred to as leaf-CUs although the 16×16 CU was never split.

Moreover, TUs of leaf-CUs may also be associated with respective quadtree data structures. That is, a leaf-CU may include a quadtree indicating how the leaf-CU is partitioned into TUs. This disclosure refers to the quadtree indicating how an LCU is partitioned as a CU quadtree and the quadtree indicating how a leaf-CU is partitioned into TUs as a TU quadtree. The root node of a TU quadtree generally corresponds to a leaf-CU, while the root node of a CU quadtree generally corresponds to an LCU. TUs of the TU quadtree that are not split are referred to as leaf-TUs.

A leaf-CU may include one or more prediction units (PUs). In general, a PU represents all or a portion of the corresponding CU, and may include data for retrieving a reference sample for the PU. For example, when the PU is inter-mode encoded, the PU may include data defining a motion vector for the PU. The data defining the motion vector may describe, for example, a horizontal component of the motion vector, a vertical component of the motion vector, a resolution for the motion vector (e.g., one-quarter pixel precision or one-eighth pixel precision), a reference frame to which the motion vector points, and/or a reference list (e.g., list 0 or list 1) for the motion vector. Data for the leaf-CU defining the PU(s) may also describe, for example, partitioning of the CU into one or more PUs. Partitioning modes may differ depending on whether the CU is uncoded, intra-prediction mode encoded, or inter-prediction mode encoded. For intra coding, a PU may be treated the same as a leaf transform unit described below.

As an example, the HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

To code a block (e.g., a prediction unit of video data), a predictor for the block is first derived. The predictor, also referred to as a predictive block, can be derived either through intra (I) prediction (i.e., spatial prediction) or inter (P or B) prediction (i.e. temporal prediction). Hence, some prediction units may be intra-coded (I) using spatial prediction with respect to reference samples in neighboring reference blocks in the same frame (or slice), and other prediction units may be uni-directionally inter-coded (P) or bi-directionally inter-coded (B) with respect to blocks of reference samples in other previously-coded frames (or slices). In each case, the reference samples may be used to form a predictive block for a block to be coded.

Upon identification of a predictive block, the difference between the original video data block and its predictive block is determined. This difference may be referred to as the prediction residual data, and indicates the pixel differences between the pixel values in the block to the coded and the pixel values in the predictive block selected to represent the coded block. To achieve better compression, the prediction residual data may be transformed, e.g., using a discrete cosine transform (DCT), an integer transform, a Karhunen-Loeve (K-L) transform, or another transform.

The residual data in a transform block, such as a TU, may be arranged in a two-dimensional (2D) array of pixel difference values residing in the spatial, pixel domain. A transform converts the residual pixel values into a two-dimensional array of transform coefficients in a transform domain, such as a frequency domain. For further compression, the transform coefficients may be quantized prior to entropy coding. An entropy coder then applies entropy coding, such as CAVLC, CABAC, PIPE, or the like, to the quantized transform coefficients.

To entropy code a block of quantized transform coefficients, a scanning process is usually performed so that the two-dimensional (2D) array of quantized transform coefficients in a block is rearranged, according to a particular scan order, into an ordered, one-dimensional (1D) array, i.e., vector, of transform coefficients. Entropy coding is then applied to the vector of transform coefficients. The scan of the quantized transform coefficients in a transform unit serializes the 2D array of transform coefficients for the entropy coder. A significance map may be generated to indicate the positions of significant (i.e., non-zero) coefficients. Scanning may be applied to scan levels of significant (i.e., nonzero) coefficients, and/or to code signs of the significant coefficients.

In HEVC, position information of the significant transform coefficients (e.g., the significance map) is first coded for a TU to indicate the location of the last non-zero coefficient in the scan order. The significance map and the level information (the absolute values and signs of the coefficients) are coded for each coefficient in an inverse scan order.

Following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m. In some examples, video encoder 20 may utilize a predefined scan order to scan the quantized transform coefficients to produce a serialized vector that can be entropy encoded. In other examples, video encoder 20 may perform an adaptive scan.

Figure 2A:
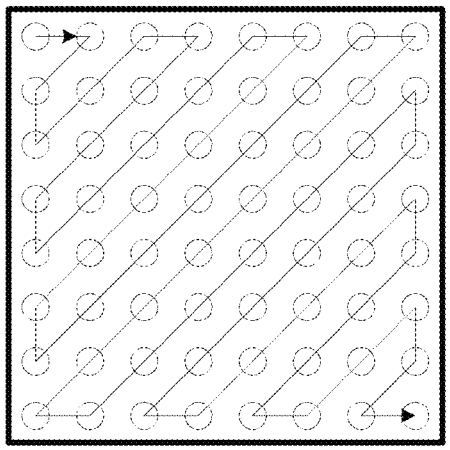
FIGS. 2A-2D illustrate exemplary coefficient value scan orders.
Figure 2B:
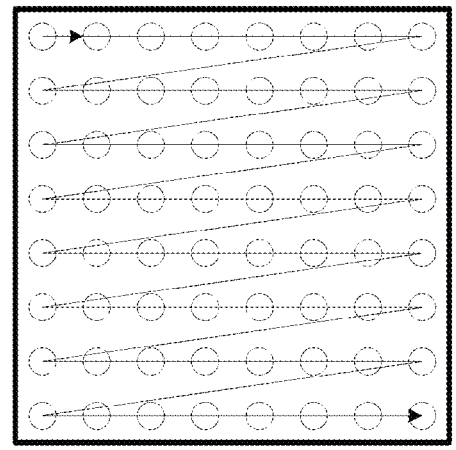
Figure 2C:
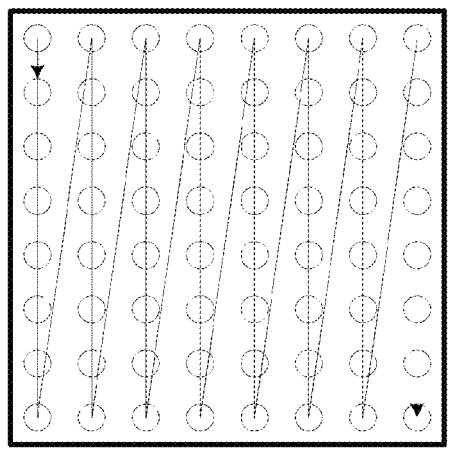
Figure 2D:
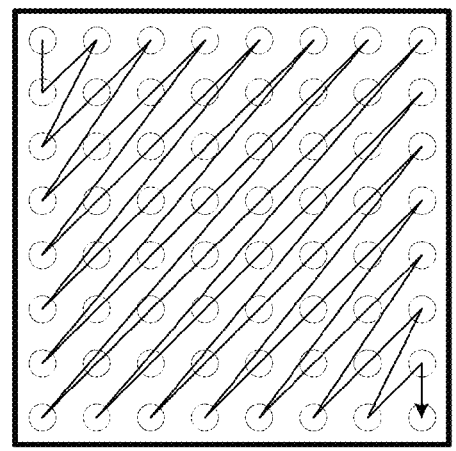

FIGS. 2A-2D illustrate some different exemplary scan orders. Other defined scan orders, or adaptive (changing) scan orders may also be used. FIG. 2A illustrates a zig-zag scan order, FIG. 2B illustrates a horizontal scan order, FIG. 2C illustrates a vertical scan orders, and FIG. 2D illustrates a diagonal scan order. Combinations of these scan orders can also be defined and used. In some examples, the techniques of this disclosure may be specifically applicable during coding of a so-called significance map in the video coding process.

One or more syntax elements may be defined to indicate a position of a last significant coefficient (i.e., non-zero coefficient), which may depend on the scan order associated with a block of coefficients. For example, one syntax element may define a column position of a last significant coefficient within a block of coefficient values and another syntax element may define a row position of the last significant coefficient within a block of coefficient values.

Figure 3:
FIG. 3 illustrates one example of a significance map relative to a block of coefficient values.

FIG. 3 illustrates one example of a significance map relative to a block of coefficient values. The significance map is shown on the right, in which one-bit flags identify the coefficients in the video block on the left that are significant, i.e., non-zero. In one example, given a set of significant coefficients (e.g., defined by a significance map) and a scan order, a position of a last significant coefficient may be defined. In the emerging HEVC standard, transform coefficients may be grouped into a chunk. The chunk may comprise an entire TU, or in some cases, TUs may be sub-divided into smaller chunks. The significance map and level information (absolute value and sign) are coded for each coefficient in a chunk. In one example, a chunk consists of 16 consecutive coefficients in an inverse scan order (e.g., diagonal, horizontal, or vertical) for a 4×4 TU and an 8×8 TU. For 16×16 and 32×32 TUs, the coefficients within a 4×4 sub-block are treated as a chunk. The syntax elements are coded and signaled to represent the coefficients level information within a chunk. In one example, all the symbols are encoded in an inverse scan order. The techniques of this disclosure may improve the coding of a syntax element used to define this position of the last significant coefficient of a block of coefficients.

As one example, the techniques of this disclosure may be used to code the position of the last significant coefficient of a block of coefficients (e.g., a TU or a chunk of a TU). Then, after coding the position of the last significant coefficient, the level and sign information associated with transform coefficients may be coded. The coding of the level and sign information may process according to a five pass approach by coding the following symbols in inverse scan order (e.g., for a TU or a chunk of the TU):

significant_coeff_flag (abbr. sigMapFlag): this flag may indicate the significance of each coefficient in a chunk. A coefficient with a value of one or greater may be consider to be significant.

coeff_abs_level_greater1_flag (abbr. gr1Flag): this flag may indicate whether the absolute value of the coefficient is larger than one for the non-zero coefficients (i.e., coefficients with sigMapFlag as 1).

coeff_abs_level_greater2_flag (abbr. gr2Flag): this flag may indicate whether the absolute value of the coefficient is larger than two for the coefficients with an absolute value larger than one (i.e., coefficients with gr1Flag as 1).

coeff_sign_flag (abbr. signFlag): this flag may indicate the sign information for the non-zero coefficients. For example, a zero for this flag may indicate a positive sign, while a 1 may indicate a negative sign.

coeff_abs_level_remain (abbr. levelRem): this syntax element may indicate the remaining absolute value of a transform coefficient level. For this syntax element, the absolute value of the coefficient−x may be coded as (abs(level)−x) for each coefficient with the amplitude larger than x. The value of x depends on the presence of the gr1Flag and gr2Flag. If the gr2Flag has been coded, the levelRem value is calculated as (abs(level)−2). If the gr2Flag has not been coded, but the gr1Flag has been coded, the levelRem value is calculated as (abs(level)−1).

In this manner, transform coefficients for a TU or a portion (e.g., chunk) of a TU can be coded. In any case, the techniques of this disclosure, which concern the coding of a syntax element used to define the position of the last significant coefficient of a block of coefficients, may also be used with other types of techniques for ultimately coding the level and sign information of transform coefficients. The five pass approach for coding significance, level and sign information is just one example technique that may be used following the coding of the position of the last significant coefficient of a block, as set forth in this disclosure.

After scanning the quantized transform coefficients to form a one-dimensional vector, video encoder 20 may entropy encode the one-dimensional vector of transform coefficients. Video encoder 20 may also entropy encode syntax elements associated with the encoded video data for use by video decoder 30 in decoding the video data. Entropy encoding may be performed according to one of the following techniques: CAVLC, CABAC, syntax-based context-adaptive binary arithmetic coding (SBAC), PIPE coding or another entropy encoding methodology. To perform CAVLC, video encoder 20 may select a variable length code for a symbol to be transmitted. Codewords in variable length coding (VLC) may be constructed such that relatively shorter codes correspond to more probable symbols, while longer codes correspond to less probable symbols. In this way, the use of VLC may achieve a bit savings over, for example, using equal-length codewords for each symbol to be transmitted.

The entropy coding techniques of this disclosure are specifically described as being applicable to CABAC, although the techniques may also be applicable to CAVLC, SBAC, PIPE, or other techniques. It should be noted that PIPE uses principles similar to those of arithmetic coding.

In general, coding data symbols using CABAC may involve one or more of the following steps:

(1) Binarization: If a symbol to be coded is non-binary valued, it is mapped to a binary sequence, i.e. a so called "bin string." Each binary index (i.e., "bin") in the bin string can have a value of "0" or "1."

(2) Context Assignment: In regular mode, each bin is assigned to a context. A bin may also be coding according to a by-pass mode where a context is not assigned. A context is a probability model and is often referred to as "context model." As used herein, the term context may refer to a probability model or a probability value. A context determines how a probability of a bin's value is calculated for a given bin. The context may associate the probability of a bin's value based on information such as values of previously encoded symbols or a bin number. Further, a context may be assigned to a bin based on higher level (e.g., slice) parameters (3) Bin encoding: Bins are encoded with an arithmetic encoder. To encode a bin, the arithmetic encoder requires as an input a probability of the bin's value, i.e., a probability that the bin's value is equal to "0," and/or a probability that the bin's value is equal to "1." The (estimated) probability may be represented in a context by an integer value referred to as a "context state."

(4) State update: The probability (state) for a selected context may be updated based on the actual coded value of the bin (e.g., if the bin value was "1," the probability of a bin being "1" may be increased). The updating of probabilities may be governed according to the transition rules associated with a context.

The following is an example binarization technique of the last significant coefficient syntax elements that may be performed by video encoder 20. The last significant coefficient syntax elements may include a row and column position of a last significant coefficient within a two dimensional block (i.e., an x and y coordinate). For an 8×8 block, there are eight different possibilities for the last position of a coefficient within a column or row, i.e., 0, 1, . . . , 7. Eight different bins are used to represent these eight row or column positions. For example, bin0=1 may indicate that the coefficient at row or column 0 is the last significant coefficient. In this example, if bin0=0, then the coefficient at location 0 is not the last coefficient. Another bin equal to 1 may indicate the position of the last significant coefficient. For example, bin1=1 may indicate that location 1 is the last significant coefficient. As another example, binX=1 may indicate that location X is the last significant coefficient. As described above, each bin may be encoded by two different methods: (1) encode the bin with a context and (2) encode the bin using bypass mode (without a context).

Table 1 shows of an example binarization of a position of a last significant coefficient where some bins are encoded with a context and others are encoded using a bypass mode. The example in Table 1 provides an example binarization of last significant coefficient for a 32×32 TU. The second column of Table 1 provides corresponding truncated unary prefix values for possible values of the position of a last significant coefficient within a TU of size T of defined by the maximum truncated unary prefix length of $2 \log_2(T)-1$. The third column of Table 1 provides a corresponding fixed length suffix for each truncated unary prefix. For the sake of brevity, Table 1 includes X values that indicate either a one or zero bit value. It should be noted that the X values uniquely map each value sharing a truncated unary prefix according to a fixed length code. The magnitude of the last position component in Table 1 may correspond to an x-coordinate value and/or a y-coordinate value. It should be noted that binarization of the last significant coefficient for a 4×4, 8×8, and 16×16 TU may be defined in a manner similar to the binarization of a 32×32 TU described with respect to Table 1.

TABLE 1

Binarization for a TU of size 32 × 32, where X means 1 or 0.

| Magnitude of last position component | Truncated unary (context model) | Fixed binary (bypass) | f_value |
|---|---|---|---|
| 0 | 1 | — | 0 |
| 1 | 01 | — | 0 |
| 2 | 001 | — | 0 |
| 3 | 0001 | — | 0 |
| 4-5 | 00001 | X | 0-1 |
| 6-7 | 000001 | X | 0-1 |
| 8-11 | 0000001 | XX | 0-3 |
| 12-15 | 00000001 | XX | 0-3 |
| 16-23 | 000000001 | XXX | 0-7 |
| 24-31 | 000000000 | XXX | 0-7 |

As described above, coding data symbols using CABAC may also involve context assignment. In one example, context modeling may be used for arithmetic encoding of the truncated unary strings portion of the bin string, while context modeling is not used for arithmetic encoding of the fixed binary strings of the bin string (i.e. the fixed binary string is bypassed). In the case where truncated unary strings are encoded using context modeling, a context may be assigned to each of bin index of a binary string.

There are several ways in which contexts may be assigned to each bin index of a binary string. The number of context assignments for a bin string representing the position of the last significant coefficient may be equal to the number of bin indexes or length of a truncated unary string for possible TU sizes and color components. For example, if the possible sizes of a luma component are 4×4, 8×8, 16×16 and 32×32, the number of context assignments for one dimension may equal 60 (i.e., 4+8+16+32), when none of the bins are bypassed. Likewise, for each chroma component with possible sizes of 4×4, 8×8, and 16×16, the number of context assignments may equal 28 (i.e., 4+8+16), when none of the bins are bypassed. Thus, a maximum number of context assignments may equal 116 (i.e., 60+28+28) for each dimension when the position of a last significant coefficient is specified using both an x and y coordinate. The example context assignments below assume some bins will be bypassed according to the binarization scheme described with respect to Table 1. However, it should be noted that the context assignment techniques described herein may be applicable to several binarization schemes. Further, even when it is assumed that some bins will be bypassed, there are still numerous ways in which contexts may be assigned to bins of a bin string representing the position of the last significant coefficient.

In some cases it may be desirable to reduce the total number of contexts relative to the number of required number of context assignments. In this manner, an encoder or decoder may not need to store and maintain as many contexts. However, when the number of contexts is reduced, prediction accuracy may also be reduced, for example, if contexts are shared for two bins with different probabilities. Further, a particular context may be updated more frequently, which may affect the estimated probability of a bin's value. That is, coding a bin using an assigned context may involve updating a context. Thus, a subsequent bin assigned to the context may be coded using the updated context. Further, it should be noted that in some examples context models may be initialized for on a slice level, such that the values of bins within a slice may not affect the coding of bins within a subsequent slice, although the bins are assigned the same context. This disclosure describes techniques for optimizing context assignments, such that a number of contexts can be reduced while maintaining accuracy for estimated probabilities. In one example, the context assignment techniques described herein include techniques where individual bin indices are assigned the same context.

Tables 2-13 below illustrate context assignments for the bin indices of a bin string representing the position of a last significant coefficient within a TU. It should be noted that for some bins in Tables 2-13 (e.g., bins 5-7 of an 8×8 block) there are no contexts assigned. This is because it is assumed that these bins will be coded using a bypass mode, as described above. It should also be noted that the values in Table 2-13 represent an index of a context. In the Tables 2-13 when different bins have the same context index value they share the same context. The mapping of a context index to an actual context may be defined according to a video coding standard. Tables 2-13 illustrate how a context may commonly assigned to bins.

Table 2 illustrates a possible context indexing for each bin of different TU sizes for the example binarizations provided above with respect to Table 1 above. In the example in Table 2, adjacent bins are allowed to share the same contexts. For example, bins 2 and 3 of an 8×8 TU share the same context.

TABLE 2

Context assignment for last position coding

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 5 | 6 | | | | |
| TU 16 × 16 | 7 | 8 | 9 | 9 | 10 | 10 | 11 | | |
| TU 32 × 32 | 12 | 13 | 14 | 14 | 15 | 15 | 16 | 16 | 17 |

Tables 3-6 each illustrate further examples of context assignments according to the following rules:
1. First K bins do not share contexts, where K>1. K could be different for each TU size.
2. One context can only be assigned to consecutive bins. For example, bin 3-bin5 could use context 5. However, bin3 and bin5 using context 5 and bin4 using context 6 is not allowed.
3. The last N bin, N>=0, of different TU sizes can share the same context.
4. The number of bins that share the same context increases with TU sizes.

Rules 1-4 above may be particularly useful for the binarization provided in Table 1. However, rules 1-4 may be equally useful for other the binarization schemes and the actual context assignments may be adjusted accordingly to the binarization scheme that is implemented.

TABLE 3

Example of last position bins according to Rules 1-4

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 7 | | | | |
| TU 16 × 16 | 8 | 9 | 10 | 11 | 11 | 12 | 12 | | |
| TU 32 × 32 | 13 | 14 | 14 | 15 | 16 | 16 | 16 | 16 | 17 |

TABLE 4

Example of last position bins according to Rules 1-4

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 6 | | | | |
| TU 16 × 16 | 8 | 9 | 10 | 11 | 11 | 12 | 12 | | |
| TU 32 × 32 | 13 | 14 | 14 | 15 | 16 | 16 | 16 | 16 | 17 |

TABLE 5

Example of last position bins according to Rules 1-4

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 7 | | | | |
| TU 16 × 16 | 8 | 9 | 10 | 11 | 11 | 12 | 12 | | |
| TU 32 × 32 | 13 | 14 | 14 | 15 | 16 | 16 | 16 | 12 | 12 |

TABLE 6

Example of last position bins according to Rules 1-4

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 5 | 6 | 7 | | | | |
| TU 16 × 16 | 8 | 9 | 10 | 10 | 11 | 11 | 12 | | |
| TU 32 × 32 | 13 | 14 | 14 | 15 | 15 | 15 | 16 | 16 | 16 |

Tables 7-8 below provide example context assignments where last bins from different block sizes share the same context, which can further optimize the number of contexts. In one example, direct mapping may be used to determining how contexts are shared between the last bins of two or more block sizes. For example, for a block A and a block B with sizes M and N, respectively, the context of the n-th bin of block A may use the same context as the n-th bin of block size B

TABLE 7

Example of last position bins where block sizes share the same contexts.

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 12 | 13 | 14 | | | | | | |
| TU 8 × 8 | 12 | 13 | 14 | 14 | 15 | | | | |
| TU 16 × 16 | 12 | 13 | 14 | 14 | 15 | 15 | 16 | | |
| TU 32 × 32 | 12 | 13 | 14 | 14 | 15 | 15 | 16 | 16 | 17 |

Table 8 shows another example where the last position bins from some block sizes share the contexts with each other. In this case, TUs of size 8×8 and 16×16 share the same contexts.

TABLE 8

Example of last position bins where some block sizes (8 × 8 and 16 × 16) share the same contexts.

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 7 | 8 | 9 | 9 | 10 | | | | |
| TU 16 × 16 | 7 | 8 | 9 | 9 | 10 | 10 | 11 | | |
| TU 32 × 32 | 12 | 13 | 14 | 14 | 15 | 15 | 16 | 16 | 17 |

In another example, the mapping of contexts for last position bins from different block sizes may be derived using a function f(.). For example, the n-th bin in block size A may share the same contexts with the m-th bin in block size B, where m is a function of n (m=f(n)). For example, the function can be linear, i.e., m=n*a+b, where a and b are parameters of the linear function. Table 9 shows an example where a=1, b=1, A=an 8×8 TU and B=a 16×16 TU.

TABLE 9

Example of last positions bins with shared contexts based on a linear function

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 8 | 9 | 9 | 10 | 10 | | | | |
| TU 16 × 16 | 7 | 8 | 9 | 9 | 10 | 10 | 11 | | |
| TU 32 × 32 | 12 | 13 | 14 | 14 | 15 | 15 | 16 | 16 | 17 |

It should be noted that when applying the above equation in certain cases, due to integer operation, there may be rounding involved. For example, 7*0.5=3.

According to the following example, the mapping from location n in an 8×8 block size to a location m in a 4×4 block may be calculated with the following equation:

$$m=f(n)=n>>1, \text{ which means } a=0.5, b=0, A=8\times 8, B=4\times 4 \quad (1)$$

The mapping from location n in a 16×16 block to a location m in a 4×4 block can be calculated with the following equation:

$$m=f(n)=n>>2, \text{ which means } a=0.5, b=0, A=16\times 16, B=4\times 4 \quad (2)$$

As described above, equations (1) and (2) are only a couple of examples that may be used to implement a mapping between blocks of different sizes. Equations (1) and (2) may be referred to as mapping functions. It should be noted that the ">>" in equations (1) and (2) may represent a shift operation defined according to a video coding standard, such as HEVC. Further, other equations may be used to achieve the same mapping or different mappings.

Table 10 provides an example context assignment for the last significant coefficient for 4×4, 8×8, and 16×16 TUs according to equations (1) and (2).

TABLE 10

Context mapping for Transform Units of Different Size

| | Bin index | | | | | | | |
|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 0 | 0 | 1 | 1 | 2 | | | | |
| TU 16 × 16 | 0 | 0 | 0 | 0 | 1 | 1 | 1 | | |

Table 11 provides an example of the context assignment of Table 10 where different context index values are used (i.e., 15-17 instead of 0-2). As described above, the values of the context indices in Tables 3-12 are not intended to limit the actual contexts assigned to a binary index.

TABLE 11

Context mapping for Transform Units of Different Size

| | Bin index | | | | | | | |
|---|---|---|---|---|---|---|---|---|
| | 0 | 1 | 2 | 3 | 4 | 5 | 6 | 7 | 8 |
| TU 4 × 4 | 15 | 16 | 17 | | | | | | |
| TU 8 × 8 | 15 | 15 | 16 | 16 | 17 | | | | |
| TU 16 × 16 | 15 | 15 | 15 | 15 | 16 | 16 | 16 | | |

In should be noted that the mapping of contexts in Table 11 is equivalent to the following mapping function:

$$\text{ctx\_index} = (n >> k) + 15 \quad (3)$$

where ctx_index is the index of the context;

n = Bin index k = log 2TrafoDimension−2;

log 2TrafoDimension = log 2 (width) for last position in x dimension;

log 2TrafoDimension = log 2 (height) for last position in y dimension.

In some cases the function defined in (1)-(3) may be used by a coding device to build a series of tables which may be stored in memory and utilized to look-up context assignments. In some cases, the tables may be predetermined based on the equations and rules described herein and stored in both video encoder 20 and video decoder 30.

Further, in some examples, functions (1)-(3) defined above may be selectively applied to assign contexts for particular bins. In this manner, different bins may be assigned a context based on different rule. In one example, the functions, such as those described above, may only apply for a bin index (i.e., a value of n) that is smaller than a threshold Th1, and/or larger than a threshold Th2. Table 12 shows an example where the mapping techniques described above are selectively applied based on the value of the bin index, i.e., n>Th2=2.

TABLE 12

Example of last position bins with shared contexts based on a linear function and a threshold

| | Bin index | | | | | | | | |
|---|---|---|---|---|---|---|---|---|---|
| | 0 | 1 | 2 | 3 | 4 | 5 | 6 | 7 | 8 |
| TU 4 × 4 | 0 | 1 | 2 | | | | | | |
| TU 8 × 8 | 3 | 4 | 9 | 10 | 10 | | | | |
| TU 16 × 16 | 7 | 8 | 9 | 9 | 10 | 10 | 11 | | |
| TU 32 × 32 | 12 | 13 | 14 | 14 | 15 | 15 | 16 | 16 | 17 |

In another example, the threshold value for applying techniques to bin indices can be different for different block sizes, different frame types, different color components (Y,U,V), and/or other side information. This threshold can be pre-defined according to a video coding standard or can be signaled using high level syntax. For example, the threshold may be signaled in a sequence parameter set (SPS), a picture parameter set (PPS), an adaptation parameter set (APS), and/or a slice header.

In another example, a mapping function may be different for different block sizes, different frame types, different color components (Y, U, and V), and/or other side information. The mapping function can be pre-defined according to a video coding standard or can be signaled using high level syntax. For example, the mapping function may be signaled in an SPS, a PPS, an APS, and/or a slice header.

In another example, the direct mapping and function mapping techniques described above may be adaptively applied based on color components, frame type, quantization parameter (QP) and/or other side information. For example, the direct mapping or function mapping techniques may only be applied to chroma components. The rules for this adaptivity can be pre-defined or can be signaled using high level syntax. For example, the rules for adaptivity may be signaled in an SPS, a PPS, an APS, and/or a slice header.

In another example, last position bins for chroma and luma components can share the same contexts. This may apply for any block size, e.g., 4×4, 8×8, 16×16, or 32×32. Table 13 shows an example where contexts are shared for last position bins of luma and chroma components for a 4×4 TU.

TABLE 13

Example of last position bins for luma and chroma components in a 4 × 4 TU

| | Bin index | | | |
|---|---|---|---|---|
| | 0 | 1 | 2 | 3 |
| Luma TU 4 × 4 | 0 | 1 | 2 | |
| Chroma TU 4 × 4 | 0 | 1 | 2 | |

Figure 4:
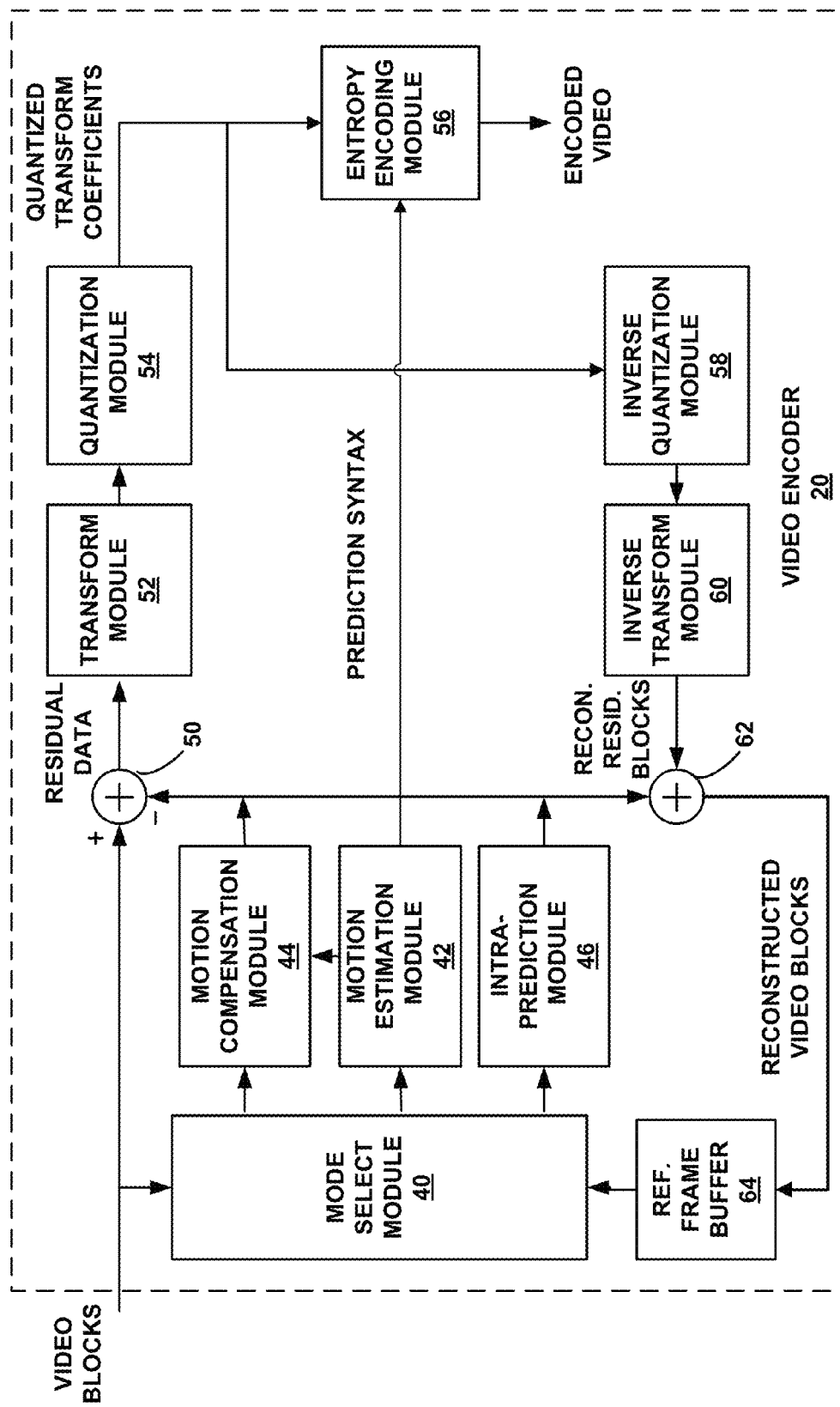
FIG. 4 is a block diagram illustrating an example video encoder that may implement the techniques described in this disclosure.

FIG. 4 is a block diagram illustrating an example of a video encoder 20 that may use techniques for coding transform coefficients as described in this disclosure. For example, video encoder 20 represents an example of a video encoder configured to obtain a binary string indicating a position of a last significant coefficient within a video block; determine a context for a binary index of the binary string based on a video block size, wherein the context is assigned to at least two binary indices, wherein each of the at least two binary indices are associated with different video block sizes; and encode the binary string using CABAC based at least in part on the determined context. The video encoder 20 will be described in the context of HEVC coding for purposes of illustration, but without limitation of this disclosure as to other coding standards or methods that may require scanning of transform coefficients. The video encoder 20 may perform intra- and inter-coding of CUs within video frames. Intra-coding relies on spatial prediction to reduce or remove spatial redundancy in video data within a given video frame. Inter-coding relies on temporal prediction to reduce or remove temporal redundancy between a current frame and previously coded frames of a video sequence. Intra-mode (I-mode) may refer to any of several spatial-based video compression modes. Inter-modes such as uni-directional prediction (P-mode) or bi-directional prediction (B-mode) may refer to any of several temporal-based video compression modes.

As shown in FIG. 4, the video encoder 20 receives a current video block within a video frame to be encoded. In the example of FIG. 4, the video encoder 20 includes a mode select module 40, a motion estimation module 42, a motion compensation module 44, an intra-prediction module 46, a reference frame buffer 64, a summer 50, a transform module 52, a quantization module 54, and an entropy encoding module 56. The transform module 52 illustrated in FIG. 4 is the module that applies the actual transform or combinations of transform to a block of residual data, and is not to be confused with a block of transform coefficients, which also may be referred to as a transform unit (TU) of a CU. For video block reconstruction, the video encoder 20 also includes an inverse quantization module 58, an inverse transform module 60, and a summer 62. A deblocking filter (not shown in FIG. 4) may also be included to filter block boundaries to remove blockiness artifacts from reconstructed video. If desired, the deblocking filter would typically filter the output of the summer 62.

During the encoding process, the video encoder 20 receives a video frame or slice to be coded. The frame or slice may be divided into multiple video blocks, e.g., largest coding units (LCUs). The motion estimation module 42 and the motion compensation module 44 perform inter-predictive coding of the received video block relative to one or more blocks in one or more reference frames to provide temporal compression. The intra-prediction module 46 may perform intra-predictive coding of the received video block relative to one or more neighboring blocks in the same frame or slice as the block to be coded to provide spatial compression.

The mode select module 40 may select one of the coding modes, intra or inter, e.g., based on error (i.e., distortion) results for each mode, and provides the resulting intra- or inter-predicted block (e.g., a prediction unit (PU)) to the summer 50 to generate residual block data and to the summer 62 to reconstruct the encoded block for use in a reference frame. Summer 62 combines the predicted block with inverse quantized, inverse transformed data from inverse transform module 60 for the block to reconstruct the encoded block, as described in greater detail below. Some video frames may be designated as I-frames, where all blocks in an I-frame are encoded in an intra-prediction mode. In some cases, the intra-prediction module 46 may perform intra-prediction encoding of a block in a P- or B-frame, e.g., when the motion search performed by the motion estimation module 42 does not result in a sufficient prediction of the block.

The motion estimation module 42 and the motion compensation module 44 may be highly integrated, but are illustrated separately for conceptual purposes. Motion estimation (or motion search) is the process of generating motion vectors, which estimate motion for video blocks. A motion vector, for example, may indicate the displacement of a prediction unit in a current frame relative to a reference sample of a reference frame. The motion estimation module 42 calculates a motion vector for a prediction unit of an inter-coded frame by comparing the prediction unit to reference samples of a reference frame stored in the reference frame buffer 64. A reference sample may be a block that is found to closely match the portion of the CU including the PU being coded in terms of pixel difference, which may be determined by sum of absolute difference (SAD), sum of squared difference (SSD), or other difference metrics. The reference sample may occur anywhere within a reference frame or reference slice, and not necessarily at a block (e.g., coding unit) boundary of the reference frame or slice. In some examples, the reference sample may occur at a fractional pixel position.

The motion estimation module 42 sends the calculated motion vector to the entropy encoding module 56 and the motion compensation module 44. The portion of the reference frame identified by a motion vector may be referred to as a reference sample. The motion compensation module 44 may calculate a prediction value for a prediction unit of a current CU, e.g., by retrieving the reference sample identified by a motion vector for the PU.

The intra-prediction module 46 may intra-predict the received block, as an alternative to inter-prediction performed by the motion estimation module 42 and the motion compensation module 44. The intra-prediction module 46 may predict the received block relative to neighboring, previously coded blocks, e.g., blocks above, above and to the right, above and to the left, or to the left of the current block, assuming a left-to-right, top-to-bottom encoding order for blocks. The intra-prediction module 46 may be configured with a variety of different intra-prediction modes. For example, the intra-prediction module 46 may be configured with a certain number of directional prediction modes, e.g., thirty-four directional prediction modes, based on the size of the CU being encoded.

The intra-prediction module 46 may select an intra-prediction mode by, for example, calculating error values for various intra-prediction modes and selecting a mode that yields the lowest error value. Directional prediction modes may include functions for combining values of spatially neighboring pixels and applying the combined values to one or more pixel positions in a PU. Once values for all pixel positions in the PU have been calculated, the intra-prediction module 46 may calculate an error value for the prediction mode based on pixel differences between the PU and the received block to be encoded. The intra-prediction module 46 may continue testing intra-prediction modes until an intra-prediction mode that yields an acceptable error value is discovered. The intra-prediction module 46 may then send the PU to the summer 50.

The video encoder 20 forms a residual block by subtracting the prediction data calculated by the motion compensation module 44 or the intra-prediction module 46 from the original video block being coded. The summer 50 represents the component or components that perform this subtraction operation. The residual block may correspond to a two-dimensional matrix of pixel difference values, where the number of values in the residual block is the same as the number of pixels in the PU corresponding to the residual block. The values in the residual block may correspond to the differences, i.e., error, between values of co-located pixels in the PU and in the original block to be coded. The differences may be chroma or luma differences depending on the type of block that is coded.

The transform module 52 may form one or more transform units (TUs) from the residual block. The transform module 52 selects a transform from among a plurality of transforms. The transform may be selected based on one or more coding characteristics, such as block size, coding mode, or the like. The transform module 52 then applies the selected transform to the TU, producing a video block comprising a two-dimensional array of transform coefficients.

The transform module 52 may send the resulting transform coefficients to the quantization module 54. The quantization module 54 may then quantize the transform coefficients. The entropy encoding module 56 may then perform a scan of the quantized transform coefficients in the matrix according to a scanning mode. This disclosure describes the entropy encoding module 56 as performing the scan. However, it should be understood that, in other examples, other processing modules, such as the quantization module 54, could perform the scan.

The inverse quantization module 58 and the inverse transform module 60 apply inverse quantization and inverse transformation, respectively, to reconstruct the residual block in the pixel domain, e.g., for later use as a reference block. The motion compensation module 44 may calculate a reference block by adding the residual block to a predictive block of one of the frames of the reference frame buffer 64. Reference frame buffer 64 is sometimes referred to as a decoded picture buffer (DPB). The motion compensation module 44 may also apply one or more interpolation filters to the reconstructed residual block to calculate sub-integer pixel values for use in motion estimation. The summer 62 adds the reconstructed residual block to the motion compensated prediction block produced by the motion compensation module 44 to produce a reconstructed video block for storage in the reference frame buffer 64. The reconstructed video block may be used by the motion estimation module 42 and the motion compensation module 44 as a reference block to inter-code a block in a subsequent video frame.

Once the transform coefficients are scanned into the one-dimensional array, the entropy encoding module 56 may apply entropy coding such as CAVLC, CABAC, SBAC, PIPE, or another entropy coding methodology to the coefficients. In some cases, the entropy encoding module 56 may be configured to perform other coding functions, in addition to entropy coding. For example, the entropy encoding module 56 may be configured to determine coded block pattern (CBP) values for CU's and PU's. Also, in some cases, the entropy encoding module 56 may perform run length coding of coefficients. Following the entropy coding by the entropy encoding module 56, the resulting encoded video may be transmitted to another device, such as the video decoder 30, or archived for later transmission or retrieval.

In accordance with the techniques of this disclosure, the entropy encoding module 56 may select the context used to encode syntax elements based on, for example, the context assignments described above with respect to Table 2-13 and any combination of the following: an intra-prediction direction for intra-prediction modes, a scan position of the coefficient corresponding to the syntax elements, block type, transform type, and/or other video sequence properties.

In one example, entropy encoding module 56 may encode the position of a last significant coefficient using the binarization technique adopted in HEVC described above with respect to Table 1. In other examples, entropy encoding module 56 may encode the position of a last significant coefficient using other binarization techniques. In one example, a codeword for the position of a last significant coefficient may include a truncated unary code prefix followed by a fixed length code suffix. In one example, each magnitude of last position may use the same binarization for all possible TU sizes, except when the last position is equal to the TU size minus 1. This exception is due to the properties of truncated unary coding. In one example, the position of a last significant coefficient within a rectangular transform coefficient may be specified by specifying an x-coordinate value and a y-coordinate value. In another example, a transform coefficient block may be in the form of a 1×N vector and the position of the last significant coefficient within the vector may be specified by a single position value.

Figure 5:
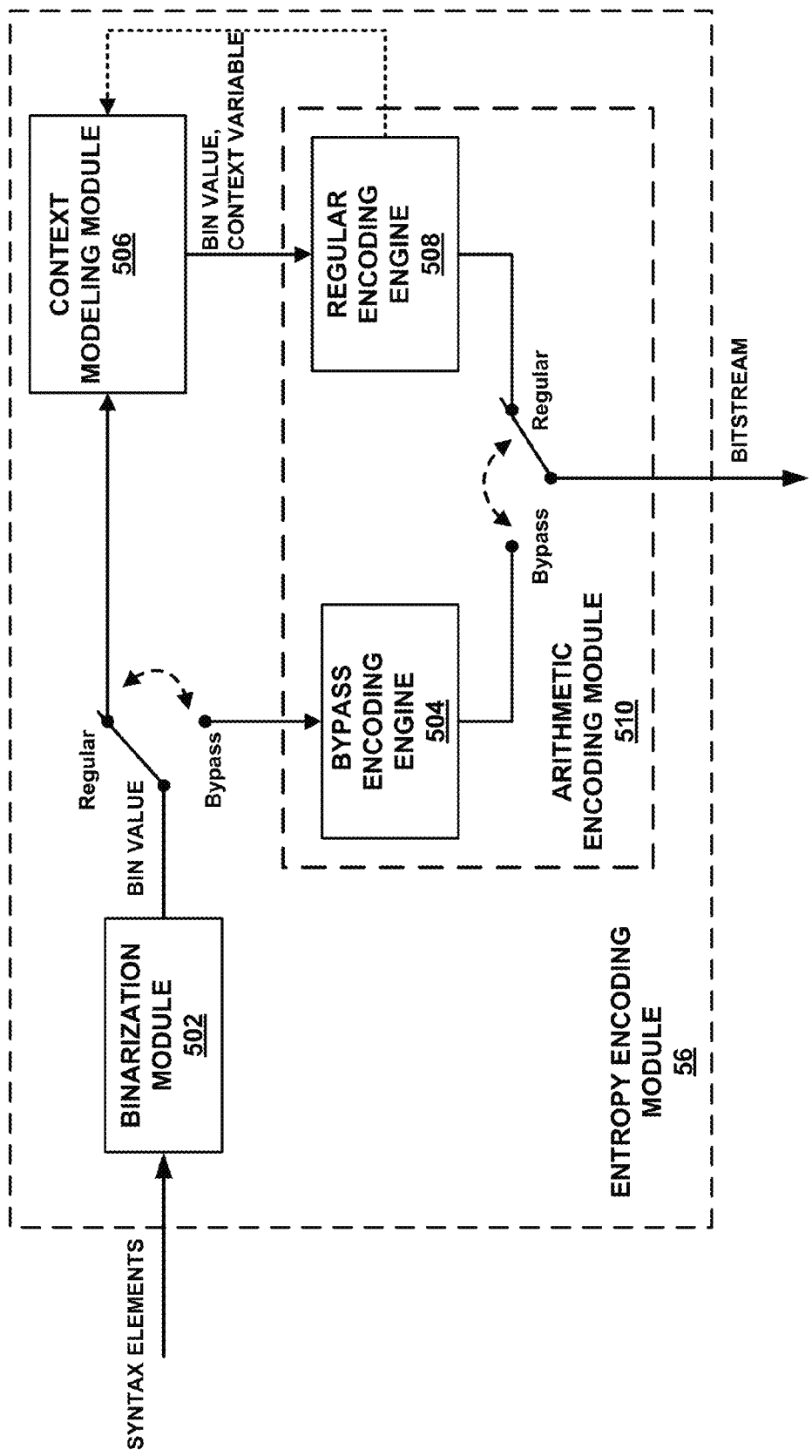
FIG. 5 is a block diagram illustrating an example entropy encoder that may implement the techniques described in this disclosure.

FIG. 5 is a block diagram that illustrates an example entropy encoding module 56 that may implement the techniques described in this disclosure. In one example, the entropy encoding module 56 illustrated in FIG. 5 may be a CABAC encoder. The example entropy encoding module 56 may include a binarization module 502, an arithmetic encoding module 510, which includes a bypass encoding engine 504 and a regular encoding engine 508, and a context modeling module 506. Entropy encoding module 56 receives syntax elements, such as one or more syntax elements representing the position of the last significant transform coefficient within a transform block coefficients and encodes the syntax element into a bitstream. The syntax elements may include a syntax element specifying an x-coordinate of the position of a last significant coefficient within a transform coefficient block and a syntax element specifying a y-coordinate of the position of a last significant coefficient within a transform coefficient block.

Binarization module 502 receives a syntax element and produces a bin string (i.e., binary string). In one example, binarization module 502 receives syntax elements representing the last position of a significant coefficient within a block of transform coefficients and produces a bin string according to the example described above with respect to Table 1. Arithmetic encoding module 510 receives a bin string from binarization module 502 and performs arithmetic encoding on the bin string. As shown in FIG. 5, arithmetic encoding module 510 may receive bin values from a bypass path or the regular coding path. Consistent with the CABAC process described above, in the case where arithmetic encoding module 510 receives bin values from a bypass path, bypass encoding engine 504 may perform arithmetic encoding on bin values without utilizing a context assigned to a bin value. In one example, bypass encoding engine 504 may assume equal probabilities for possible values of a bin.

In the case where arithmetic encoding module 510 receives bin values through the regular path, context modeling module 506 may provide a context variable (e.g., a context state), such that regular encoding engine 508 may perform arithmetic encoding based on the context assignments provided by context modeling module 506. In one example, arithmetic encoding module 510 may encode a prefix portion of a bit string using a context assignment and may encode a suffix portion of a bit string without using context assignments. The context assignments may be defined according to the examples described above with respect to Tables 2-13. The context models may be stored in memory. Context modeling module 506 may include a series of indexed tables and/or utilize mapping functions to determine a context and a context variable for a particular bin. After encoding a bin value, regular encoding engine 508, may update a context based on the actual bin values and output the encoded bin value as part of a bitstream. In this manner, entropy encoding module is configured to encode one or more syntax elements based on the context assignment techniques described herein.

Figure 6:
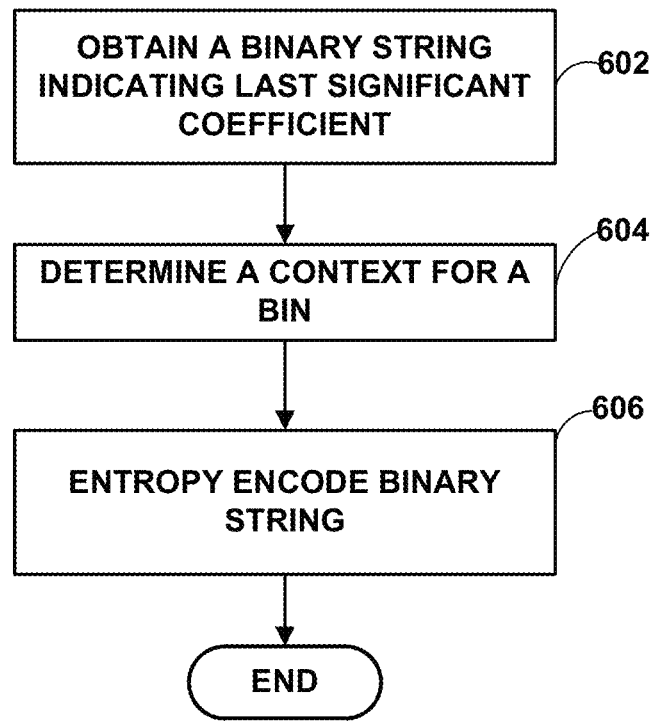
FIG. 6 is a flowchart illustrating an example of encoding a binary string value indicating the position of a last significant coefficient according to the techniques of this disclosure.

FIG. 6 is a flowchart illustrating an example method for determining a context for a binary string value indicating the position of a last significant coefficient in accordance with the techniques of this disclosure. The method described in FIG. 6 may be performed by any of the example video encoders or entropy encoders described herein. At step 602, a binary string indicating the position of a last significant transform coefficient within a video block is obtained. The binary string may be defined according to the binarization scheme described with respect to Table 1. At step 604, a context is determined for a bin value of the binary string. A context may be assigned to a bin based on the techniques described herein. The context may be determined by a video or entropy encoder accessing a look-up table or performing a mapping function. The context may be used to derive a particular context variable for a particular bin. A context variable may be a 7-bit binary value indicating one of 64 possible probabilities (states) and a most probably state (e.g., "1" or "0"). As described above, in some cases, bins may share contexts according to the mapping functions and Tables 2-13 described above. At step 606, a bin value is encoded using an arithmetic encoding process that utilizes a context variable, such as CABAC. It should be noted that when bins share contexts, the value of one bin may affect the value of a context variable used to encode a subsequent bin according to context adaptive encoding techniques. For example, if a particular bin is "1" a subsequent bin may be encoded based on an increased probability of being 1. In this manner, entropy encoding the binary string may include updating a context state of a context model. Further, it should be noted that in some examples context models may be initialized for on a slice level, such that the values of bins within a slice may not affect the encoding of bins within a subsequent slice.

Figure 7:
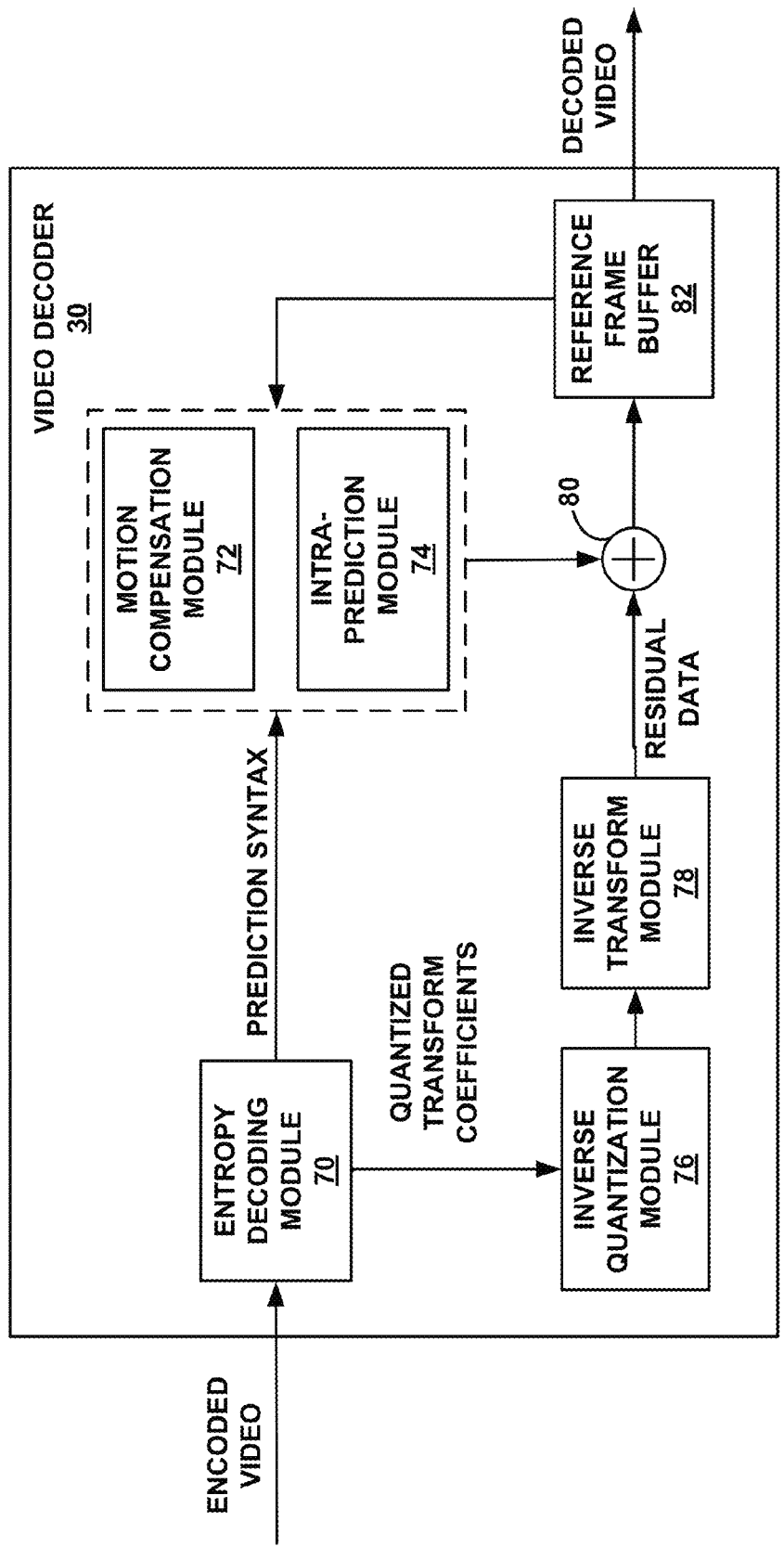
FIG. 7 is a block diagram illustrating an example video decoder that may implement the techniques described in this disclosure.

FIG. 7 is a block diagram illustrating an example of a video decoder 30 that may use techniques for coding transform coefficients as described in this disclosure. For example, video decoder 30 represents an example of a video decoder configured to obtain an encoded binary string indicating a position of a last significant coefficient within a video block, wherein the encoded binary string is encoded using CABAC; determine a context for a binary index of the encoded binary string based on a video block size, wherein the context is assigned to at least two binary indices, wherein each of the at least two binary indices are associated with different video block sizes; and decode the encoded binary string using CABAC based at least in part on the determined context.

In the example of FIG. 7, the video decoder 30 includes an entropy decoding module 70, a motion compensation module 72, an intra-prediction module 74, an inverse quantization module 76, an inverse transformation module 78, a reference frame buffer 82 and a summer 80. The video decoder 30 may, in some examples, perform a decoding pass generally reciprocal to the encoding pass described with respect to the video encoder 20.

The entropy decoding module 70 performs an entropy decoding process on the encoded bitstream to retrieve a one-dimensional array of transform coefficients. The entropy decoding process used depends on the entropy coding used by the video encoder 20 (e.g., CABAC, CAVLC, etc.). The entropy coding process used by the encoder may be signaled in the encoded bitstream or may be a predetermined process.

In some examples, the entropy decoding module 70 (or the inverse quantization module 76) may scan the received values using a scan mirroring the scanning mode used by the entropy encoding module 56 (or the quantization module 54) of the video encoder 20. Although the scanning of coefficients may be performed in the inverse quantization module 76, scanning will be described for purposes of illustration as being performed by the entropy decoding module 70. In addition, although shown as separate functional modules for ease of illustration, the structure and functionality of the entropy decoding module 70, the inverse quantization module 76, and other modules of the video decoder 30 may be highly integrated with one another.

The inverse quantization module 76 inverse quantizes, i.e., de-quantizes, the quantized transform coefficients provided in the bitstream and decoded by the entropy decoding module 70. The inverse quantization process may include a conventional process, e.g., similar to the processes proposed for HEVC or defined by the H.264 decoding standard. The inverse quantization process may include use of a quantization parameter QP calculated by the video encoder 20 for the CU to determine a degree of quantization and, likewise, a degree of inverse quantization that should be applied. The inverse quantization module 76 may inverse quantize the transform coefficients either before or after the coefficients are converted from a one-dimensional array to a two-dimensional array.

The inverse transform module 78 applies an inverse transform to the inverse quantized transform coefficients. In some examples, the inverse transform module 78 may determine an inverse transform based on signaling from the video encoder 20, or by inferring the transform from one or more coding characteristics such as block size, coding mode, or the like. In some examples, the inverse transform module 78 may determine a transform to apply to the current block based on a signaled transform at the root node of a quadtree for an LCU including the current block. Alternatively, the transform may be signaled at the root of a TU quadtree for a leaf-node CU in the LCU quadtree. In some examples, the inverse transform module 78 may apply a cascaded inverse transform, in which inverse transform module 78 applies two or more inverse transforms to the transform coefficients of the current block being decoded.

The intra-prediction module 74 may generate prediction data for a current block of a current frame based on a signaled intra-prediction mode and data from previously decoded blocks of the current frame. The motion compensation module 72 may retrieve the motion vector, motion prediction direction and reference index from the encoded bitstream. The reference prediction direction indicates whether the inter-prediction mode is uni-directional (e.g., a P frame) or bi-directional (a B frame). The reference index indicates which reference frame the candidate motion vector is based on. Based on the retrieved motion prediction direction, reference frame index, and motion vector, the motion compensation module 72 produces a motion compensated block for the current portion. These motion compensated blocks essentially recreate the predictive block used to produce the residual data.

The motion compensation module 72 may produce the motion compensated blocks, possibly performing interpolation based on interpolation filters. Identifiers for interpolation filters to be used for motion estimation with sub-pixel precision may be included in the syntax elements. The motion compensation module 72 may use interpolation filters as used by the video encoder 20 during encoding of the video block to calculate interpolated values for sub-integer pixels of a reference block. The motion compensation module 72 may determine the interpolation filters used by the video encoder 20 according to received syntax information and use the interpolation filters to produce predictive blocks.

Additionally, the motion compensation module 72 and the intra-prediction module 74, in an HEVC example, may use some of the syntax information (e.g., provided by a quadtree) to determine sizes of LCUs used to encode frame(s) of the encoded video sequence. The motion compensation module 72 and the intra-prediction module 74 may also use syntax information to determine split information that describes how each CU of a frame of the encoded video sequence is split (and likewise, how sub-CUs are split). The syntax information may also include modes indicating how each split is encoded (e.g., intra- or inter-prediction, and for intra-prediction an intra-prediction encoding mode), one or more reference frames (and/or reference lists containing identifiers for the reference frames) for each inter-encoded PU, and other information to decode the encoded video sequence.

The summer 80 combines the residual blocks with the corresponding prediction blocks generated by the motion compensation module 72 or the intra-prediction module 74 to form decoded blocks. If desired, a deblocking filter may also be applied to filter the decoded blocks in order to remove blockiness artifacts. The decoded video blocks are then stored in the reference frame buffer 82, which provides reference blocks for subsequent motion compensation and also produces decoded video for presentation on a display device (such as the display device 32 of FIG. 1). Reference frame buffer 82 may also be referred to as a DPB.

Figure 8:
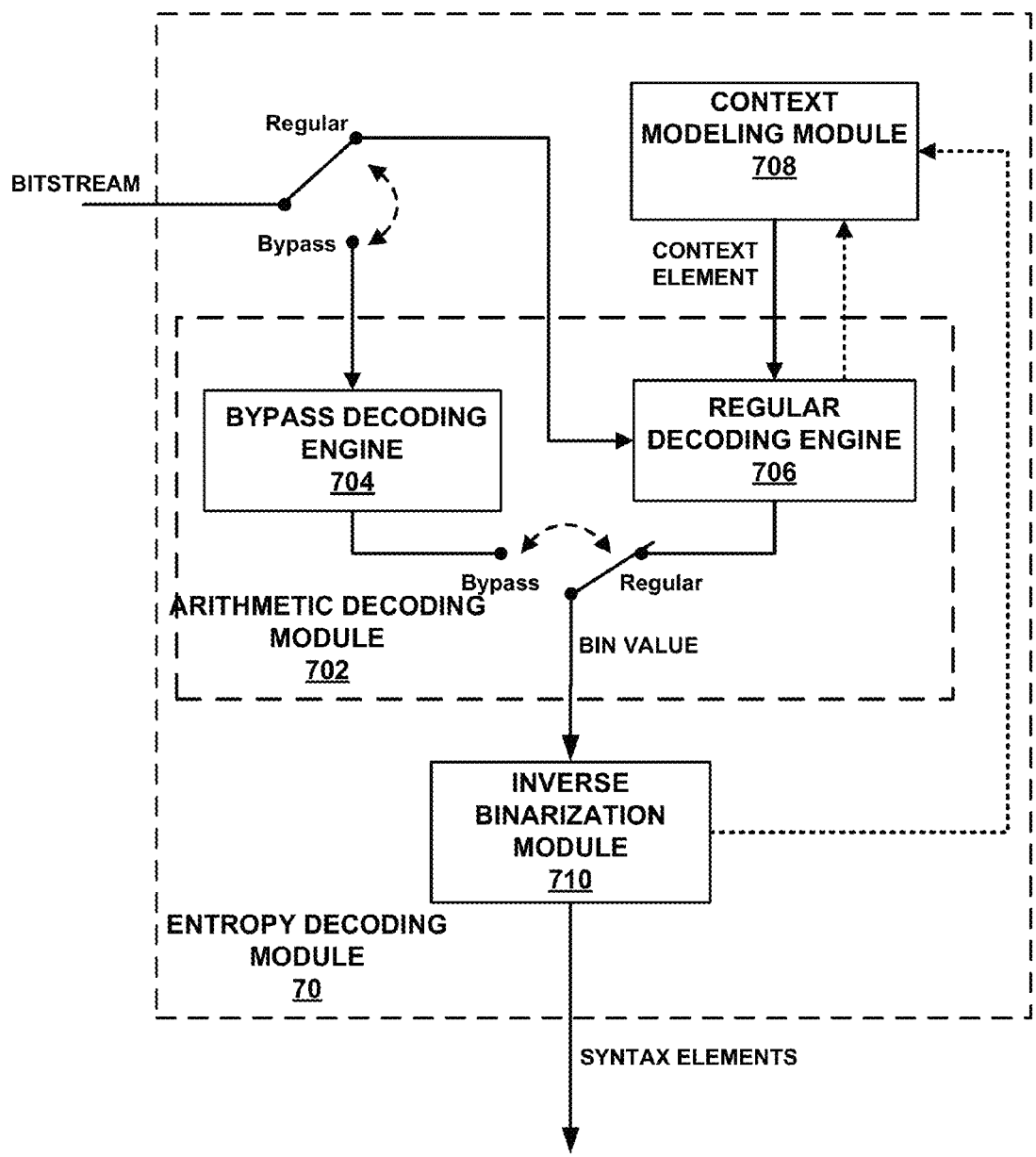
FIG. 8 is a block diagram illustrating an example entropy decoder that may implement the techniques described in this disclosure.

FIG. 8 is a block diagram that illustrates an example entropy decoding module 70 that may implement the techniques described in this disclosure. Entropy decoding module 70 receives an entropy encoded bitstream and decodes syntax elements from the bitstream. In one example, syntax elements may represent the position of the last significant transform coefficient within a transform block coefficients. The syntax elements may include a syntax element specifying an x-coordinate of the position of a last significant coefficient within a transform coefficient block and a syntax element specifying a y-coordinate of the position of a last significant coefficient within a transform coefficient block. In one example, the entropy decoding module 70 illustrated in FIG. 8 may be a CABAC decoder. The example entropy decoding module 70 in FIG. 8 includes an arithmetic decoding module 702, which may include a bypass decoding engine 704 and a regular decoding engine 706. The example entropy decoding module 70 also includes context modeling unit 708 and inverse binarization module 710. The example entropy decoding module 70 may perform the reciprocal functions of the example entropy encoding module 56 described with respect to FIG. 5. In this manner entropy decoding module 70 may perform entropy decoding based on the context assignment techniques described herein.

Arithmetic decoding module 702 receives an encoded bit stream. As shown in FIG. 8, arithmetic decoding module 702 may process encoded bin values according to a bypass path or the regular coding path. An indication whether an encoded bin value should be processed according to a bypass path or a regular pass may be signaled in the bitstream with higher level syntax. Consistent with the CABAC process described above, in the case where arithmetic decoding module 702 receives bin values from a bypass path, bypass decoding engine 704 may perform arithmetic decoding on bin values without utilizing a context assigned to a bin value. In one example, bypass decoding engine 704 may assume equal probabilities for possible values of a bin.

In the case where arithmetic decoding module 702 receives bin values through the regular path, context modeling module 708 may provide a context variable, such that regular decoding engine 706 may perform arithmetic decoding based on the context assignments provided by context modeling module 708. The context assignments may be defined according to the examples described above with respect to Tables 2-13. The context models may be stored in memory. Context modeling module 708 may include a series of indexed tables and/or utilize mapping functions to determine a context and a context variable portion of an encoded bitstream. After decoding a bin value, regular decoding engine 706, may update a context based on the decoded bin values. Further, inverse binarization module 710 may perform an inverse binarization on a bin value and use a bin matching function to determine if a bin value is valid. The inverse binarization module 710 may also update the context modeling module based on the matching determination. Thus, the inverse binarization module 710 outputs syntax elements according to a context adaptive decoding technique. In this manner, entropy decoding module 70 is configured to decode one or more syntax elements based on the context assignment techniques described herein.

Figure 9:
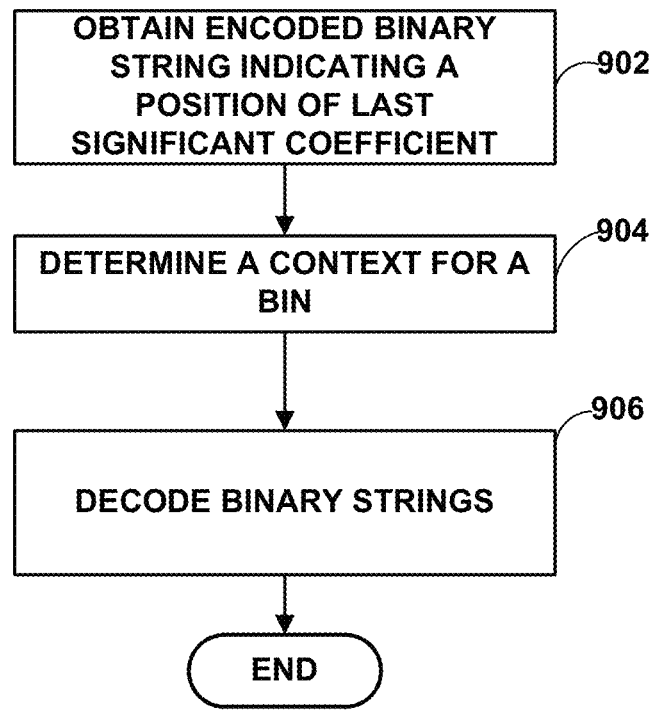
FIG. 9 is a flowchart illustrating an example of decoding a binary string value indicating the position of a last significant coefficient according to the techniques of this disclosure.

FIG. 9 is a flowchart illustrating an example method for determining a value indicating the position of a last significant coefficient within a transform coefficient from a binary string in accordance with the techniques of this disclosure. The method described in FIG. 9 may be performed by any of the example video decoders or entropy decoding units described herein. At step 902, an encoded bitstream is obtained. An encoded bitstream may be retrieved from a memory or through a transmission. The encoded bitstream may be encoded according to a CABAC encoding process or another entropy coding process. At step 904, a context is determined for a portion of the encoded the binary string. A context may be assigned to an encoded bin based on the techniques described herein. The context may be determined by a video or entropy decoder accessing a look-up table or performing a mapping function. The context may be determine based on higher level syntax provide in the encoded bitstream. The context may be used to derive a particular context variable for a particular encoded bin. As described above, a context variable may be a 7-bit binary value indicating one of 64 possible probabilities (states) and a most probably state (e.g., "1" or "0") and in some cases, bins may share contexts. At step 906, a binary string is decoded using an arithmetic decoding process that utilizes a context variable, such as CABAC. A binary string may be decoded on a bin-by-bin basis wherein a context model is updated after decoding each bin. The decoded bitstream may include syntax elements that are further used to decode transform coefficients associated with encoded video data. In this manner, the assignment of contexts to particular bins utilizing the techniques described above may provide for efficient decoding of encoding video data.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of encoding transform coefficients for a video block, the method comprising:
   determining a binary string indicating a position of a last significant coefficient within a transform block of transform coefficients associated with the video block, the binary string including a prefix portion and a suffix portion;
   determining a context for a binary index in the prefix portion of the binary string based on the size of the transform block, wherein the context is assigned to at least two binary indices according to a context index (ctx_index) defined by the function:

$$\text{ctx\_index} = (n >> (\log_2(T) - 2)) + 15,$$

wherein n is the binary index, >> represents a binary shift operation, and T is a dimension of the transform block, and wherein each of the at least two binary indices are associated with different transform block sizes; and encoding the binary string using context adaptive binary arithmetic coding (CABAC) based at least in part on the determined context.

2. The method of claim 1, wherein the context is assigned to a last binary index of an 16×16 transform block and a last binary index of a 32×32 transform block.

3. The method of claim 2, wherein a second context is assigned to adjacent binary indices of the 16×16 transform block.

4. The method of claim 1, wherein encoding the binary string using CABAC based at least in part on the determined context includes updating the context based on the value of the binary string, and wherein the transform block is a first transform block, the method further comprising:
   determining a second binary string indicating a position of a last significant coefficient within a second transform block, wherein the first transform block and the second transform block are different sizes; and
   encoding the second binary string using CABAC based at least in part on the updated context.

5. A method of decoding transform coefficients for a video block, the method comprising:
   obtaining an encoded binary string indicating a position of a last significant coefficient within a transform block of transform coefficients associated with the video block, the encoded binary string including a prefix portion and a suffix portion, wherein the encoded binary string is encoded using context adaptive binary arithmetic coding (CABAC);
   determining a context for a binary index in the prefix portion of the encoded binary string based on the size of the transform block, wherein the context is assigned to at least two binary indices according to a context index (ctx_index) defined by the function:

$$\text{ctx\_index} = (n >> (\log_2(T) - 2)) + 15,$$

wherein n is the binary index, >> represents a binary shift operation, and T is a dimension of the transform block, and wherein each of the at least two binary indices are associated with different transform block sizes;
   decoding the encoded binary string using CABAC based at least in part on the determined context; and
   determining the position of the last significant coefficient in the transform block of the transform coefficients associated with the video block based on the decoded binary string.

6. The method of claim 5, wherein the context is assigned to a last binary index of an 16×16 transform block and a last binary index of a 32×32 transform block.

7. The method of claim 6, wherein a second context is assigned to adjacent binary indices of the 16×16 transform block.

8. The method of claim 5, wherein decoding the encoded binary string using CABAC based at least in part on the determined context includes updating the context based on the value of the encoded binary string, and wherein the transform block is a first transform block; and further comprising:
   obtaining a second encoded binary string indicating a position of a last significant coefficient within a second transform block, wherein the first transform block and the second transform block are different sizes; and
   decoding the second encoded binary string using CABAC based at least in part on the updated context.

9. An apparatus configured to encode transform coefficients for a video block, the apparatus comprising:
   means for determining a binary string indicating a position of a last significant coefficient within a transform block of transform coefficients associated with the video block, the binary string including a prefix portion and a suffix portion;

means for determining a context for a binary index in the prefix portion of the binary string based on the size of the transform block, wherein the context is assigned to at least two binary indices according to a context index (ctx_index) defined by the function:

$$ctx\_index = (n \gg (\log_2(T)-2))+15,$$

wherein n is the binary index, $\gg$ represents a binary shift operation, and T is a dimension of the transform block, and wherein each of the at least two binary indices are associated with different transform block sizes; and means for encoding the binary string using context adaptive binary arithmetic coding (CABAC) based at least in part on the determined context.

10. The apparatus of claim 9, wherein encoding the binary string using CABAC based at least in part on the determined context includes updating the context based on the value of the binary string, and wherein the transform block is a first transform block; and further comprising:

means for determining a second binary string indicating a position of a last significant coefficient within a second transform block, wherein the first transform block and the second transform block are different sizes; and means for entropy coding the second binary string using CABAC based at least in part on the updated context.

11. An apparatus configured to decode transform coefficients for a video block, the apparatus comprising:

means for obtaining an encoded binary string indicating a position of a last significant coefficient within a transform block of transform coefficients associated with the video block, the encoded binary string including a prefix portion and a suffix portion, wherein the encoded binary string is encoded using context adaptive binary arithmetic coding (CABAC);

means for determining a context for a binary index in the prefix portion of the encoded binary string based on the size of the transform block, wherein the context is assigned to at least two binary indices according to a context index (ctx_index) defined by the function:

$$ctx\_index = (n \gg (\log_2(T)-2))+15,$$

wherein n is the binary index, $\gg$ represents a binary shift operation, and T is a dimension of the transform block, and wherein each of the at least two binary indices are associated with different transform block sizes;

means for decoding the encoded binary string using CABAC based at least in part on the determined context; and means for determining the position of the last significant coefficient in the transform block of the transform coefficients associated with the video block based on the decoded binary string.

12. The apparatus of claim 11, wherein decoding the encoded binary string using CABAC based at least in part on the determined context includes updating the context based on the value of the encoded binary string, and wherein the transform block is a first transform block; and further comprising:

means for obtaining a second encoded binary string indicating a position of a last significant coefficient within a second transform block, wherein the first transform block and the second transform block are different sizes; and means for decoding the second encoded binary string using CABAC based at least in part on the updated context.

13. A device configured to encode transform coefficients for a video block, the device comprising:

a memory configured to store the transform coefficients; and a video encoder configured to:

determine a binary string indicating a position of a last significant coefficient within a transform block of the transform coefficients associated with the video block, the binary string including a prefix portion and a suffix portion;

determine a context for a binary index in the prefix portion of the binary string based on the size of the transform block, wherein the context is assigned to at least two binary indices according to a context index (ctx_index) defined by the function:

$$ctx\_index = (n \gg (\log_2(T)-2))+15,$$

wherein n is the binary index, $\gg$ represents a binary shift operation, and T is a dimension of the transform block, and wherein each of the at least two binary indices are associated with different transform block sizes; and encode the binary string using context adaptive binary arithmetic coding (CABAC) based at least in part on the determined context.

14. The device of claim 13, wherein the context is assigned to a last binary index of an 16×16 transform block and a last binary index of a 32×32 transform block.

15. The device of claim 14, wherein a second context is assigned to adjacent binary indices of the 16×16 transform block.

16. The device of claim 13, wherein encoding the binary string using (CABAC) based at least in part on the determined context includes updating the context based on the value of the binary string, and wherein the transform block is a first transform block; and wherein the video encoder is further configured to:

determine a second binary string indicating a position of a last significant coefficient within a second transform block, wherein the first transform block and the second transform block are different sizes; and encode the second binary string using CABAC based at least in part on the updated context.

17. A device configured to decode transform coefficients for a video block, the device comprising:

a memory configured to store the transform coefficients; and a video decoder configured to:

obtain an encoded binary string indicating a position of a last significant coefficient within a transform block of the transform coefficients associated with the video block, the encoded binary string including a prefix portion and a suffix portion, wherein the encoded binary string is encoded using context adaptive binary arithmetic coding (CABAC);

determine a context for a binary index in the prefix portion of the encoded binary string based on the size of the transform block, wherein the context is assigned to at least two binary indices according to a context index (ctx_index) defined by the function:

$$ctx\_index = (n \gg (\log_2(T)-2))+15,$$

wherein n is the binary index, $\gg$ represents a binary shift operation, and T is a dimension of the transform block, and wherein each of the at least two binary indices are associated with different transform block sizes;

decode the encoded binary string using CABAC based at least in part on the determined context; and determine the position of the last significant coefficient in the transform block of the transform coefficients associated with the video block based on the decoded binary string.

18. The device of claim 17, wherein the context is assigned to a last binary index of an 16×16 transform block and a last binary index of a 32×32 transform block.

19. The device of claim 18, wherein a second context is assigned to adjacent binary indices of the 16×16 transform block.

20. The device of claim 17, wherein decoding the encoded binary string using CABAC based at least in part on the determined context includes updating the context based on the value of the encoded binary string, and wherein the transform block is a first transform block; and wherein the video decoder is further configured to:

obtain a second encoded binary string indicating a position of a last significant coefficient within a second transform block, wherein the first transform block and the second transform block are different sizes; and decode the second encoded binary string using CABAC based at least in part on the updated context.

21. A non-transitory computer-readable storage medium having instructions stored thereon that upon execution cause one or more processors of a video encoding device to:

determine a binary string indicating a position of a last significant coefficient within a transform block of transform coefficients associated with a video block, the binary string including a prefix portion and a suffix portion;

determine a context for a binary index in the prefix portion of the binary string based on the size of the transform block, wherein the context is assigned to at least two binary indices according to a context index (ctx_index) defined by the function:

$$\text{ctx\_index} = (n \gg (\log_2(T) - 2)) + 15,$$

wherein n is the binary index, $\gg$ represents a binary shift operation, and T is a dimension of the transform block, and wherein each of the at least two binary indices are associated with different transform block sizes; and encode the binary string using context adaptive binary arithmetic coding (CABAC) based at least in part on the determined context.

22. The non-transitory computer-readable storage medium of claim 21, wherein the context is assigned to a last binary index of an 16×16 transform block and a last binary index of a 32×32 transform block.

23. The non-transitory computer-readable storage medium of claim 22, wherein a second context is assigned to adjacent binary indices of the 16×16 transform block.

24. The non-transitory computer-readable storage medium of claim 21, wherein encoding the binary string using CABAC based at least in part on the determined context includes updating the context based on the value of the binary string, and wherein the transform block is a first transform block; and wherein the instructions upon execution further cause one or more processors of a video encoding device to:

determine a second binary string indicating a position of a last significant coefficient within a second transform block, wherein the first transform block and the second transform block are different sizes; and encode the second binary string using CABAC based at least in part on the updated context.

25. A non-transitory computer-readable storage medium having instructions stored thereon that upon execution cause one or more processors of a video decoding device to:

obtain an encoded binary string indicating a position of a last significant coefficient within a transform block of transform coefficients associated with a video block, the encoded binary string including a prefix portion and a suffix portion, wherein the encoded binary string is encoded using context adaptive binary arithmetic coding (CABAC);

determine a context for a binary index in the prefix portion of the encoded binary string based on the size of the transform block, wherein the context is assigned to at least two binary indices according to a context index (ctx_index) defined by the function:

$$\text{ctx\_index} = (n \gg (\log_2(T) - 2)) + 15,$$

wherein n is the binary index, $\gg$ represents a binary shift operation, and T is a dimension of the transform block, and wherein each of the at least two binary indices are associated with different transform block sizes;

decode the encoded binary string using CABAC based at least in part on the determined context; and determine the position of the last significant coefficient in the transform block of the transform coefficients associated with the video block based on the decoded binary string.

26. The non-transitory computer-readable storage medium of claim 25, wherein the context is assigned to a last binary index of an 16×16 transform block and a last binary index of a 32×32 transform block.

27. The non-transitory computer-readable storage medium of claim 26, wherein a second context is assigned to adjacent binary indices of the 16×16 transform block.

28. The non-transitory computer-readable storage medium of claim 25, wherein decoding the encoded binary string using CABAC based at least in part on the determined context includes updating the context based on the value of the encoded binary string, and wherein the transform block is a first transform block; and wherein the instructions upon execution further cause one or more processors of a video encoding device to:

obtain a second encoded binary string indicating a position of a last significant coefficient within a second transform block, wherein the first transform block and the second transform block are different sizes; and decode the second encoded binary string using CABAC based at least in part on the updated context.

29. The apparatus of claim 17, wherein the device comprises one or more of:

a wireless communication device comprising at least one of a display configured to display a picture that includes the video block or a camera configured to capture the a picture that includes the video block;

a microprocessor; or an integrated circuit.

* * * * *